US011868325B2

(12) United States Patent
Doji et al.

(10) Patent No.: US 11,868,325 B2
(45) Date of Patent: Jan. 9, 2024

(54) DATA MANAGEMENT SYSTEM, MANAGEMENT METHOD, AND STORAGE MEDIUM

(71) Applicant: TOPCON CORPORATION, Tokyo (JP)

(72) Inventors: Atsushi Doji, Tokyo (JP); Toshio Yamada, Tokyo (JP); Nobuyuki Nishita, Tokyo (JP); Satoshi Yanobe, Tokyo (JP)

(73) Assignee: TOPCON CORPORATION, Tokyo (JP)

( * ) Notice: Subject to any disclaimer, the term of this patent is extended or adjusted under 35 U.S.C. 154(b) by 0 days.

(21) Appl. No.: 17/794,599

(22) PCT Filed: Feb. 15, 2021

(86) PCT No.: PCT/JP2021/005420
§ 371 (c)(1),
(2) Date: Jul. 21, 2022

(87) PCT Pub. No.: WO2021/166825
PCT Pub. Date: Aug. 26, 2021

(65) Prior Publication Data
US 2023/0074990 A1 Mar. 9, 2023

(30) Foreign Application Priority Data
Feb. 20, 2020 (JP) ................. 2020-027057

(51) Int. Cl.
*G06F 16/21* (2019.01)
(52) U.S. Cl.
CPC .................. *G06F 16/212* (2019.01)
(58) Field of Classification Search
CPC ........ G06F 16/212; G06F 30/20; G06F 30/13; Y02P 90/30
See application file for complete search history.

(56) References Cited

U.S. PATENT DOCUMENTS

| 2021/0055716 A1* | 2/2021 | Turner ................. G06F 16/289 |
| 2023/0162394 A1* | 5/2023 | MacWilliams ......... G06F 3/011 |
| | | 345/619 |

FOREIGN PATENT DOCUMENTS

| JP | 2004-062601 A | 2/2004 |
| JP | 2004-110658 A | 4/2004 |

(Continued)

OTHER PUBLICATIONS

International Search Report issued in the corresponding patent application No. PCT/JP2021/005420 dated Apr. 13, 2021.

*Primary Examiner* — Cam Y T Truong
(74) *Attorney, Agent, or Firm* — Thomas W. Cole; Calderon Safran & Cole P.C.

(57) ABSTRACT

A management system of the present invention includes a design database storing member identification information, member coordinates, and member shapes of construction members constituting a construction object, a management member selecting unit configured to select a management member to be managed among the construction members stored in the design database, a related member selecting unit configured to select a related member adjacent to the management member from the design database, a boundary information creating unit configured to select an adjacent portion between the management member and the related member, and with respect to the adjacent portion, as boundary information, associate identification information, adjacent portion coordinates, an adjacent portion shape of the adjacent portion, member identification information of the management member, and member identification information of the related member with each other, and a comparison result database configured to store information associated by the boundary information creating unit.

11 Claims, 29 Drawing Sheets

(56) References Cited

FOREIGN PATENT DOCUMENTS

| JP | 2005-182167 A | 7/2005 |
| JP | 2006-114059 A | 4/2006 |
| JP | 2019-021190 A | 2/2019 |

\* cited by examiner

Fig. 3

20
Comparison result DB

| Adjacent portion TBL 201 | Related member TBL 202 |
|---|---|
| Adjacent portion ID | Related member ID |
| Adjacent portion coordinates | Adjacent portion ID |
| Adjacent portion shape : Plane | Member ID |

Fig. 9
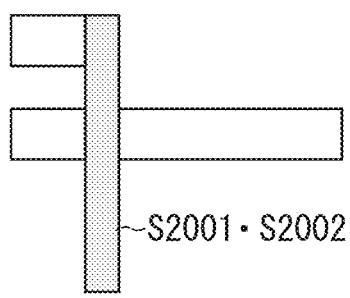
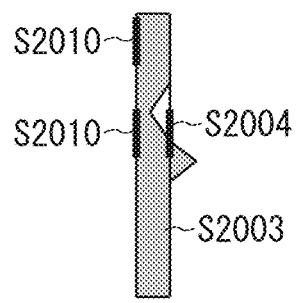
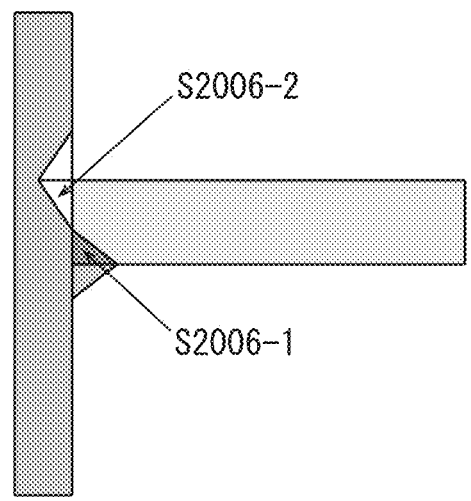

Fig. 15
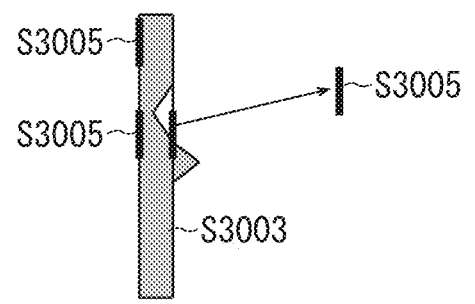
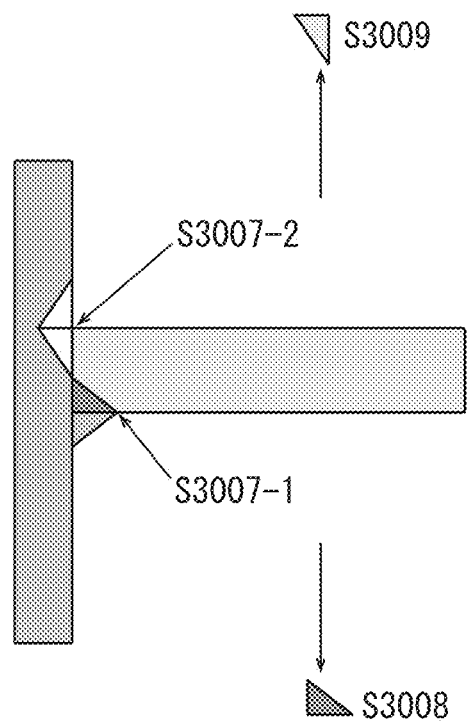

DATA MANAGEMENT SYSTEM, MANAGEMENT METHOD, AND STORAGE MEDIUM

TECHNICAL FIELD

The present invention relates to a system, method, and program for managing data for design and construction of a construction object.

BACKGROUND ART

In recent years, in the field of construction, utilization of a 3D model called BIM (Building Information Modeling) has been promoted. BIM has been increasingly utilized at design sites, that is, planning, architectural design, facility design, design analysis, execution design, construction planning, and component manufacturing. For example, Patent Literature 1 discloses a technology for utilizing BIM at manufacturing sites of members at a plant.

CITATION LIST

Patent Literature

Patent Literature 1: Japanese Published Unexamined Patent Application No. 2019-21190

SUMMARY OF INVENTION

Technical Problem

However, when measurement results of a construction status were reflected in design BIM, checking as to whether members overlap each other can be performed, but storing information in BIM as to which part of members interferes was not possible. In particular, it was not possible to check whether members are separate from each other, and information on separation of members could not be managed.

The present invention was made in view of this problem, and an object thereof is to perform data management of boundary information between members.

Solution to Problem

In order to solve the problem described above, a management method according to an aspect of the present invention includes, by transmitting and receiving information to and from a design database storing member identification information, member coordinates, and member shapes of construction members constituting a construction object, a step (A) of selecting a management member to be managed among the construction members stored in the design database, a step (B) of selecting a related member adjacent to the management member from the design database, a step (C) of selecting an adjacent portion between the management member and the related member, and a step (D) of storing, with respect to the adjacent portion, as boundary information, identification information, adjacent portion coordinates, and an adjacent portion shape of the adjacent portion, member identification information of the management member, and member identification information of the related member in association with each other in a comparison result database.

In the aspect described above, it is also preferable that, further, whether the boundary information has been created for all related members related to the management member is confirmed, and when the boundary information is not created for all of the related members, the steps (B) to (D) are performed for the related member for which the boundary information has not been created.

In the aspect described above, it is also preferable that the management method further includes, by transmitting and receiving information to and from a measurement database storing measurement data related to the construction object, a step (E) of selecting measurement data of the management member from the measurement database, a step (F) of creating an actual status model of the management member by reflecting the measurement data in a design model of the management member, a step (G) of selecting one adjacent portion of the management member by referring to the comparison result database, a step (H) of comparing, with respect to the adjacent portion, an adjacent portion shape stored in the comparison result database with a shape of the actual status model, a step (I) of determining whether there is interference or a void between the adjacent portion shape and the shape of the actual status model in the adjacent portion, a step (J) of, when interference is found in the step (I), determining that there is interference at a comparison spot being compared, and storing identification information of the adjacent portion, and identification information, comparison spot coordinates, and a comparison spot shape of the comparison spot in the comparison result database by setting attributes of the comparison spot as "Interference."

In the aspect described above, it is also preferable that the management method includes a step (K) of, when a void is found in the step (I), determining that there is a void at a comparison spot being compared, and storing identification information of the adjacent portion, and identification information, comparison spot coordinates, and a comparison spot shape of the comparison spot in the comparison result database by setting attributes of the comparison spot as "Separation."

In the aspect described above, it is also preferable that the management method includes a step (L) of, when neither interference nor a void is found in the step (I), determining that a comparison spot being compared is as designed, and storing identification information of the adjacent portion, and identification information, comparison spot coordinates, and a comparison spot shape of the comparison spot in the comparison result database by setting attributes of the comparison spot as "Problem-free."

In the aspect described above, it is also preferable that, further, whether the comparison has been finished for all adjacent portions related to the management member is confirmed, and when the comparison is continued in another adjacent portion, the steps (G) to (L) are performed for another adjacent portion.

In the aspect described above, it is also preferable that the management method includes, by transmitting and receiving information to and from a measurement database storing measurement data related to the construction object, a step (M) of selecting measurement data of the management member from the measurement database, a step (N) of creating an actual status model of the management member by reflecting the measurement data in a design model of the management member, a step (O) of selecting one adjacent portion of the management member by referring to the comparison result database, a step (P) of creating, with respect to the adjacent portion, a boundary surface model by referring to the comparison result database, a step (Q) of comparing, with respect to the adjacent portion, the boundary surface model and the actual status model, a step (R) of determining whether there is interference or a void between the boundary surface model and the actual status model in the adjacent portion, a step (S) of, when interference is found in the step (R), determining that there is interference at a comparison spot, creating a boundary model of an interference portion, and storing identification information of the adjacent portion, identification information of the comparison spot, comparison spot coordinates and a comparison spot shape based on the boundary model, and attributes "Interference" of the comparison spot in the comparison result database, a step (T) of, when a void is found in the step (R), determining that there is separation at a comparison spot, creating a boundary model of a separation portion, and storing identification information of the adjacent portion, identification information of the comparison spot, comparison spot coordinates and a comparison spot shape based on the boundary model, and attributes "Separation" of the comparison spot in the comparison result database, and a step (U) of, when neither interference nor a void is found in the step (R), determining that a comparison spot is as designed, creating a boundary model of the comparison spot, and storing identification information of the adjacent portion, identification information of the comparison spot, comparison spot coordinates and a comparison spot shape based on the boundary model, and attributes "Problem-free" of the comparison spot in the comparison result database.

In the aspect described above, it is also preferable that the management method includes a step (V) of selecting a confirming member to be confirmed among the construction members stored in the design database, a step (W) of selecting an adjacent portion having member identification information of the confirming member selected in the step (V) from the comparison result database, and a step (X) of confirming a related member of the adjacent portion selected in the step (W) from the comparison result database.

In the aspect described above, it is also preferable that the management method includes a step (Y) of selecting any one of interference, separation, and problem-free from the attributes, a step (Z) of selecting an adjacent portion having the attributes selected in the step (Y) from the comparison result database, and a step (AA) of confirming the adjacent portion selected in the step (Z).

In the aspect described above, it is also preferable that the management method includes a step (AB) of selecting any one of interference, separation, and problem-free from the attributes, a step (AC) of selecting an adjacent portion having the attributes selected in the step (AB) from the comparison result database, and a step (AD) of referring to the comparison result database for the adjacent portion selected in the step (AC), and confirming a member stored in the adjacent portion.

In the aspect described above, it is also preferable that, the design database further includes another classification information related to the construction members, and the management method includes a step (AE) of selecting any one of interference, separation, and problem-free from the attributes, a step (AF) of selecting adjacent portions having the attributes selected in the step (AE) from the comparison result database, a step (AG) of narrowing down the adjacent portions selected in the step (AF) based on the other classification information by referring to the design database, and a step (AH) of referring to the comparison result database for the adjacent portion narrowed down in the step (AG), and confirming a member stored in the adjacent portion.

A management program describing the management method according to the aspect described above as a computer program and enabling execution of the management method is also preferable.

In addition, in order to solve the problem described above, a management system according to an aspect of the present invention includes a design database storing member identification information, member coordinates, and member shapes of construction members constituting a construction object, a management member selecting unit configured to select a management member to be managed among the construction members stored in the design database, a related member selecting unit configured to select a related member adjacent to the management member from the design database, a boundary information creating unit configured to select an adjacent portion between the management member and the related member, and with respect to the adjacent portion, as boundary information, associate identification information, adjacent portion coordinates, an adjacent portion shape of the adjacent portion, member identification information of the management member, and member identification information of the related member with each other, and a comparison result database configured to store information associated by the boundary information creating unit.

In the aspect described above, it is also preferable that the management system further includes a measurement database storing measurement data related to the construction object, a measurement data selecting unit configured to select measurement data of the management member from the measurement database, an actual status model creating unit configured to create an actual status model of the management member by reflecting the measurement data in a design model of the management member, a boundary information selecting unit configured to select one adjacent portion of the management member by referring to the comparison result database, and an adjacent portion comparing unit configured to compare, with respect to the adjacent portion, an adjacent portion shape stored in the comparison result database and a shape of the actual status model, wherein the boundary information creating unit determines whether there is interference or a void between the adjacent portion shape and the shape of the actual status model in the adjacent portion, and stores identification information of the adjacent portion and identification information, comparison spot coordinates, and a comparison spot shape of a comparison spot in the comparison result database by setting attributes of the comparison spot as "Interference" when interference is found, stores identification information of the adjacent portion and identification information, comparison spot coordinates, and a comparison spot shape of the comparison spot in the comparison result database by setting attributes of the comparison spot as "Separation" when a void is found, and stores identification information of the adjacent portion, and identification information, comparison spot coordinates, and a comparison spot shape of the comparison spot in the comparison result database by setting attributes of the comparison spot as "Problem-free" when neither interference nor a void is found.

In the aspect described above, it is also preferable that the management system includes a measurement database storing measurement data related to the construction object, a measurement data selecting unit configured to select measurement data of the management member from the measurement database, an actual status model creating unit configured to create an actual status model of the management member by reflecting the measurement data in a design model of the management member, a boundary information selecting unit configured to select one adjacent portion of the management member by referring to the comparison result database, a boundary surface creating unit configured to create a boundary surface model of the adjacent portion by referring to the comparison result database, an adjacent portion comparing unit configured to compare the boundary surface model and the actual status model, and a boundary model creating unit configured to create a boundary model of an interference portion when interference is found between the boundary surface model and the actual status model, create a boundary model of a void portion when a void is found between the boundary surface model and the actual status model, and create a boundary model of a comparison spot when neither interference nor a void is found between the boundary surface model and the actual status model, wherein the boundary information creating unit stores identification information of the comparison spot, comparison spot coordinates and a comparison spot shape based on the boundary model, and the attributes "Interference," "Separation," or "Problem-free" of the comparison spot in the comparison result database.

In the aspect described above, it is also preferable that the management system includes a related member confirming unit configured to cause an administrator to select a confirming member to be confirmed among the construction members in the design database, select an adjacent portion having member identification information of the confirming member, and confirm a related member in the selected adjacent portion.

In the aspect described above, it is also preferable that the management system includes a management portion/member confirming unit configured to cause an administrator to select the attributes, select an adjacent portion having the selected attributes, and confirm the selected adjacent portion.

In the aspect described above, it is also preferable that the management system includes a management portion/member confirming unit configured to cause an administrator to select the attributes, select an adjacent portion having the selected attributes, and confirm a member stored in the selected adjacent portion.

In the aspect described above, it is also preferable that the design database includes another classification information related to the construction members, and the management system further includes a management portion/member confirming unit configured to cause an administrator to select the attributes, select adjacent portions having the selected attributes, narrow down the selected adjacent portions based on the other classification information, and confirm a member stored in the narrowed-down adjacent portion.

Advantageous Effects of Invention

According to the data management system, management method, and management program of the present invention, data management of boundary information between members can be performed.

BRIEF DESCRIPTION OF DRAWINGS

FIG. 3 is a diagram illustrating an example of a comparison result database according to the same management system.

FIG. 9 is a view illustrating a work image in the same management method.

FIG. 15 is a view illustrating a work image in the same management method.

DESCRIPTION OF EMBODIMENTS

Next, preferred embodiments of the present invention will be described with reference to the drawings.

First Embodiment

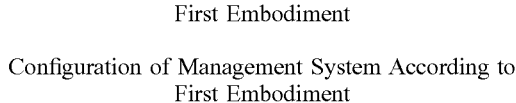

Figure 1:
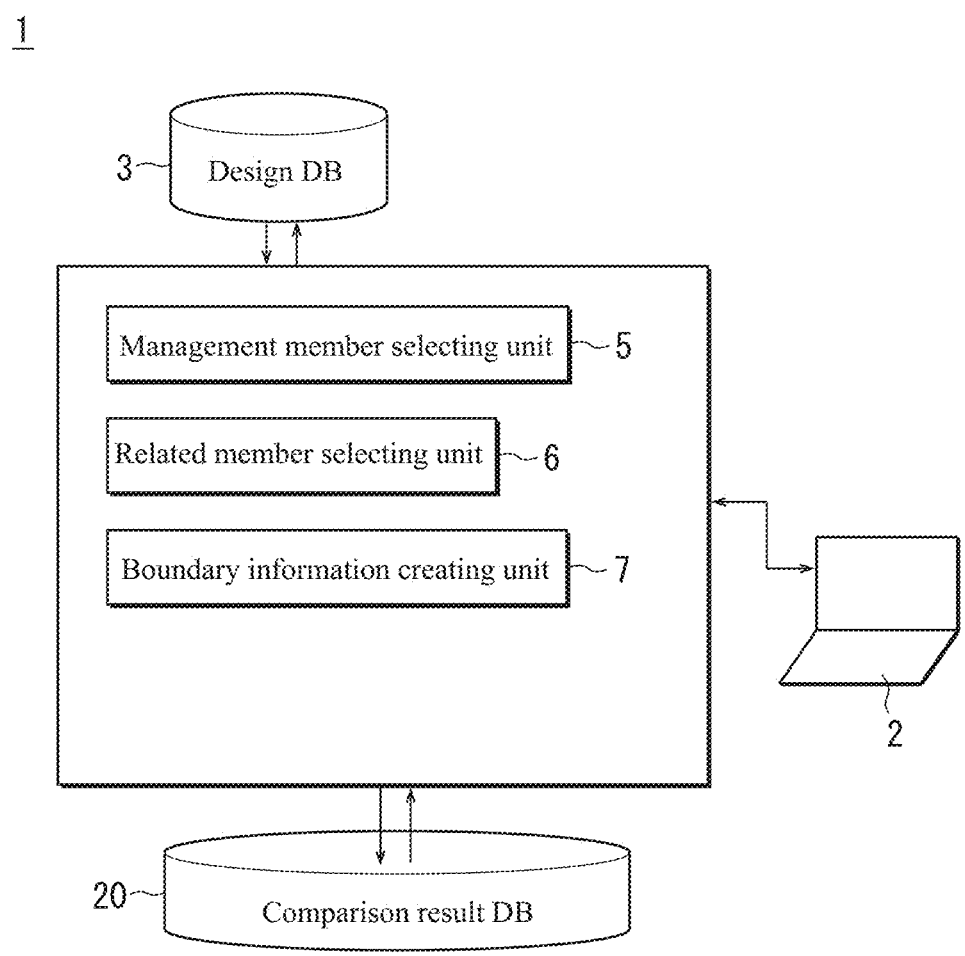
FIG. 1 is a configuration block diagram of a management system according to a first embodiment of the present invention.

FIG. 1 is a configuration block diagram of a management system 1 according to a first embodiment of the present invention. The management system 1 includes an input/output device 2, a design database 3, a management member selecting unit 5, a related member selecting unit 6, a boundary information creating unit 7, and a comparison result database 20.

The input/output device 2 is a general-purpose personal computer, tablet terminal, etc., including at least a computing unit, a storage unit, a communication unit, a display unit, and an operation unit, and can be operated by an administrator.

The respective functional units of the management member selecting unit 5, the related member selecting unit 6, and the boundary information creating unit 7 are configured by electronic circuits such as a CPU (Central Processing Unit), an ASIC (Application Specific Integrated Circuit), and a PLD (Programmable Logic Device) such as an FPGA (Field Programmable Gate Array). Each functional unit may be configured inside the input/output device 2 or either separate external hardware/software. In the latter case, each functional unit can transmit and receive information to and from the input/output device 2 through a network.

The design database 3 and the comparison result database 20 are stored in a server computer with which communication can be made through a network. The server computer can communicate with related functional units, and can transmit and receive information to and from related functional units.

Figure 2:
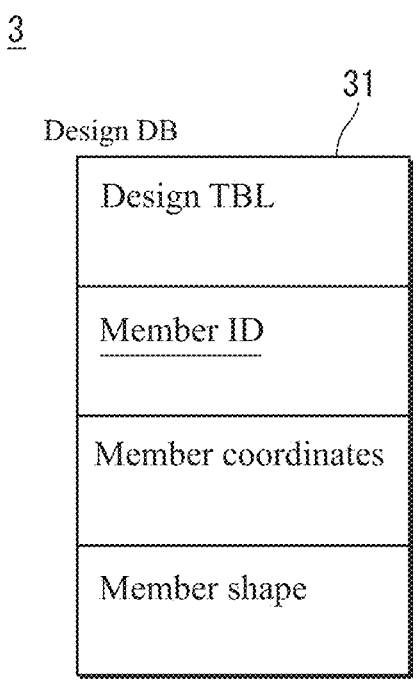
FIG. 2 is a diagram illustrating an example of a design database according to the same management system.

In the design database 3, design data based on design BIM of a construction object to be managed (data on each construction member constituting the construction object in the form of 3D model, the 3D model includes shapes of surfaces, lines, and points. Hereinafter, also referred to as design model) is stored. As illustrated in FIG. 2, the design database 3 includes a design table 31 in which, with respect to each construction member, member identification information (hereinafter referred to as member ID), member coordinates, and a member shape are associated with each other.

In the comparison result database 20, boundary information between members, that is, between a management member and a member adjacent to the management member, is stored. The comparison result database 20 includes at least an adjacent portion table 201 for managing boundaries (adjacent portions) between members, and a related member table 202 for managing related members in the adjacent portions. Preferably, as illustrated in FIG. 3, in the adjacent portion table 201, identification information (hereinafter referred to as adjacent portion ID) provided for each boundary (adjacent portion) between members, coordinates of the adjacent portion, and a shape of the adjacent portion are stored in association with each other. The shape of the adjacent portion is, for example, information on a shape of a boundary surface, such as "Plane," "Convex," "Concave," "Curve," etc. In the related member table 202, an adjacent portion ID, a member ID of a member to be managed (hereinafter referred to as "management member"), a member ID (hereinafter, this member ID is referred to as a related member ID) of a member (hereinafter referred to as "related member") adjacent to the management member and forming the adjacent portion together with the management member are stored in association with each other.

The respective functional units of the management member selecting unit 5, the related member selecting unit 6, and the boundary information creating unit 7 will be described in a management method according to the present embodiment to be described below.

Management Method According to First Embodiment

Figure 4:
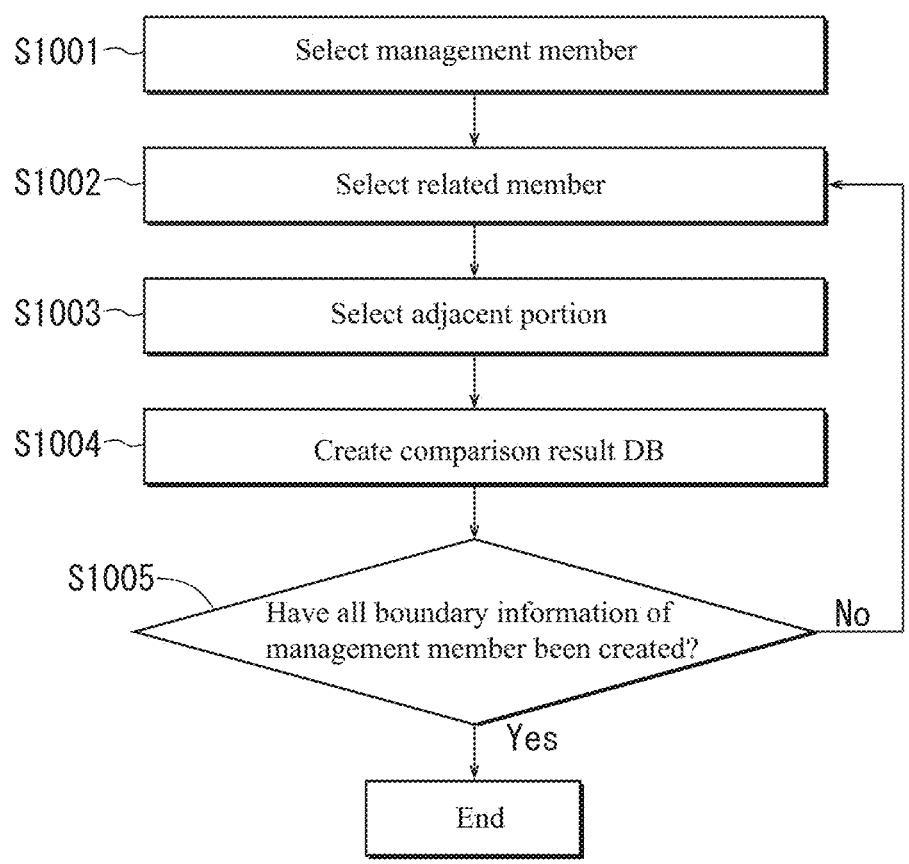
FIG. 4 is a flowchart illustrating a management method according to the first embodiment of the present invention.

A management method according to the present embodiment is data management for creating the comparison result database 20 for managing boundary information. FIG. 4 is a flowchart illustrating the management method according to the first embodiment of the present invention, and FIG. 5 is a work image view of the same flowchart.

When a management process according to the present embodiment is started, in Step S1001, the management member selecting unit 5 reads the design table 31, and displays, etc., a design model on the input/output device 2 and causes an administrator to select a "management member" to be managed. The administrator selects a management member through the input/output device 2 (also refer to S1001 in FIG. 5).

Figure 5:
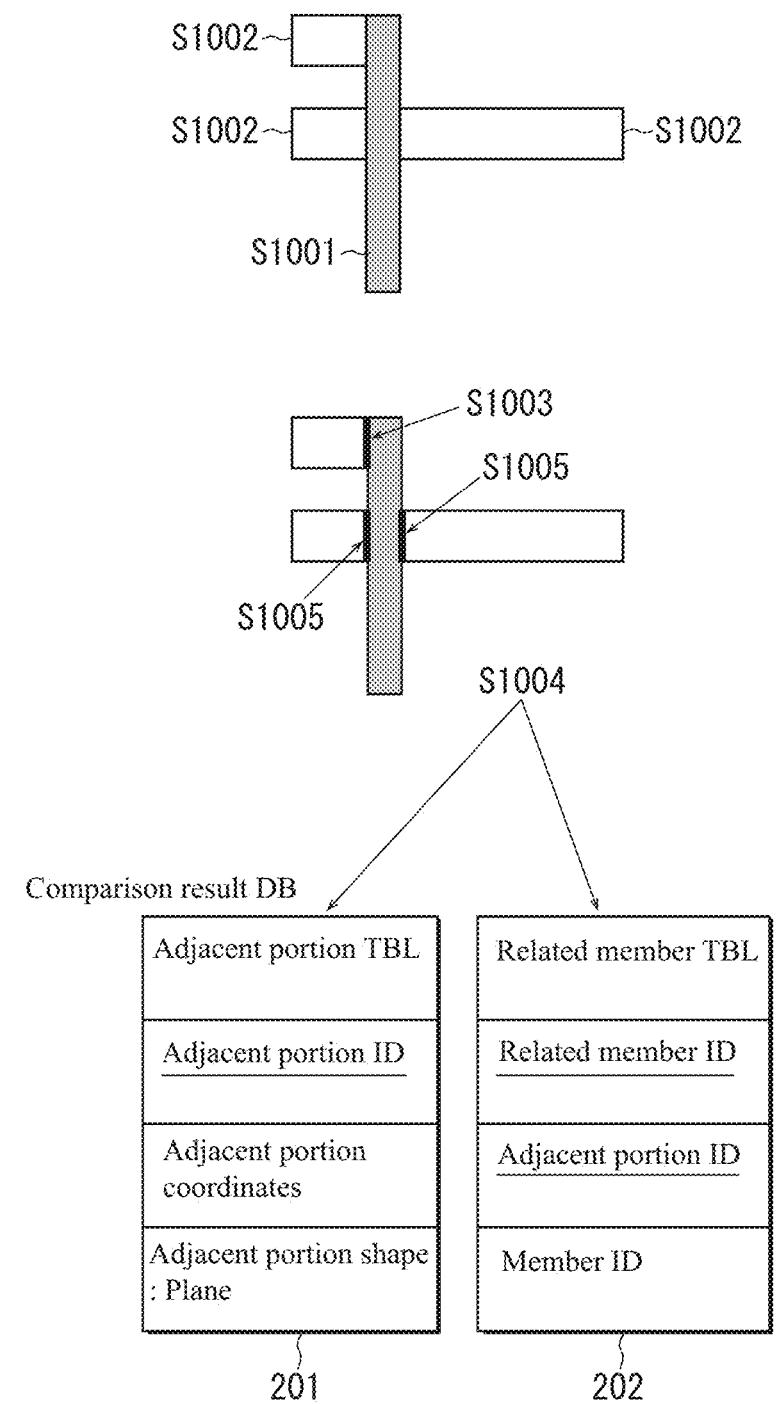
FIG. 5 is a view illustrating a work image in the same management method.

Next, the processing shifts to Step S1002, and the related member selecting unit 6 reads the design table 31, and based on data on coordinates and a shape of the management member in the design table 31, automatically extracts "related members" adjacent to the management member or causes the administrator to select "related members" by displaying, etc., design models peripheral to the management member on the input/output device 2 (also refer to S1002 in FIG. 5).

Next, the processing shifts to Step S1003, and the boundary information creating unit 7 selects one adjacent portion where a design model of the management member and a design model of the related member are adjacent to each other (also refer to S1003 in FIG. 5).

Next, the processing shifts to Step S1004, and the boundary information creating unit 7 provides an adjacent portion ID to the adjacent portion selected in Step S1003, and stores the adjacent portion ID, adjacent portion coordinates, an adjacent portion shape (boundary surface shape), a member ID of the management member, and a related member ID of the related member in corresponding portions in the adjacent portion table 201 and the related member table 202 (also refer to S1004 in FIG. 5).

Next, the processing shifts to Step S1005, and the boundary information creating unit 7 confirms the design model of the management member, and confirms whether boundary information has been created for all of the related members of the management member. When boundary information is not created for all of the related members, the processing returns to S1002, and uncreated boundary information is created (also refer to S1005 in FIG. 5), and after boundary information is created for all related members, the flow is completed.

As described above, according to the management method and the management system of the present embodiment, the boundary information between members is data-managed according to the comparison result database 20 (the adjacent portion table 201 and the related member table 202) created by being linked to the design database 3.

Second Embodiment

A management system and a management method according to the present embodiment are additionally applied to the first embodiment, and are to manage boundary information by reflecting measurement data.

Configuration of Management System According to Second Embodiment

Figure 6:
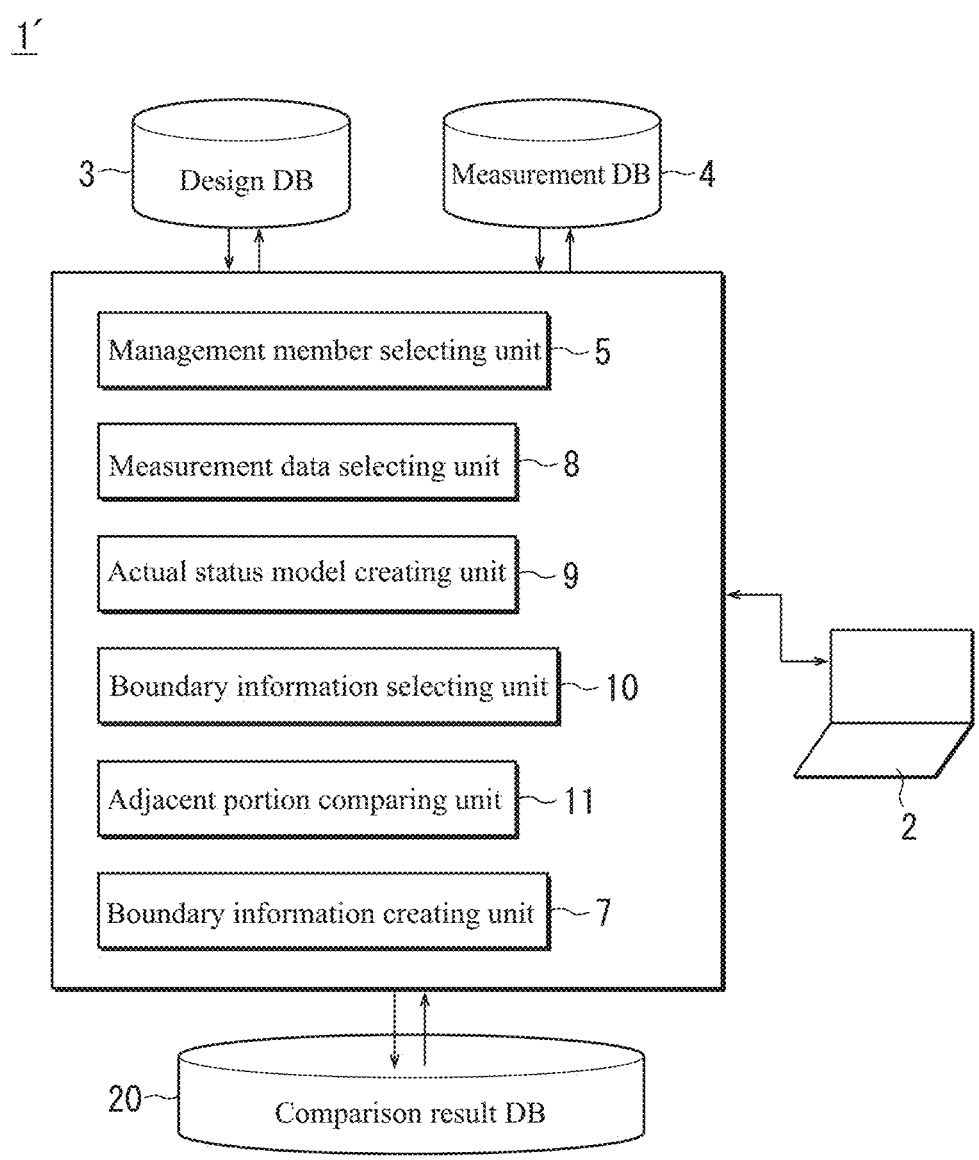
FIG. 6 is a configuration block diagram of a management system according to a second embodiment of the present invention.

FIG. 6 is a configuration block diagram of a management system 1' according to a second embodiment of the present invention. The same configuration as in the first embodiment is provided with the same reference signs, and description thereof is omitted. The management system 1' includes the input/output device 2, the design database 3, a measurement database 4, the management member selecting unit 5, a measurement data selecting unit 8, an actual status model creating unit 9, a boundary information selecting unit 10, an adjacent portion comparing unit 11, the boundary information creating unit 7, and the comparison result database 20.

Figure 7:
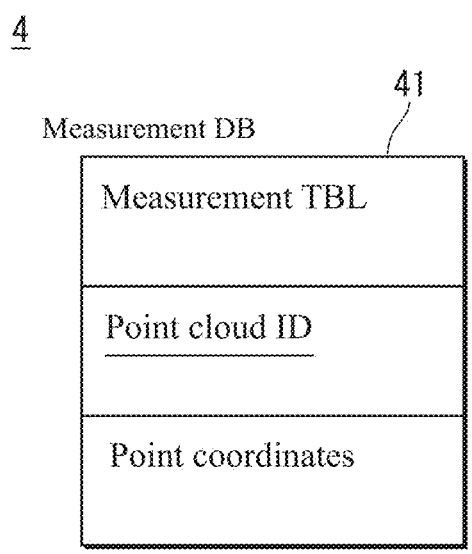
FIG. 7 is a diagram illustrating an example of a measurement database according to the same management system.

In the measurement database 4, measurement data of the construction object described above (point cloud data in which coordinate information is registered, point data, screen data holding coordinate information of measurement spots, and data on construction errors of construction members) obtained by using a scanner, etc., are stored. To the measurement data, measurement point identification information (hereinafter referred to as point cloud ID) of a measurement point is provided. The measurement database 4 includes at least a measurement table 41 in which, for each measurement point, a point cloud ID and point coordinates are associated with each other as illustrated in FIG. 7.

The measurement data selecting unit 8, the actual status model creating unit 9, the boundary information selecting unit 10, and the adjacent portion comparing unit 11 are also configured by electronic circuits as with other functional units. The measurement data selecting unit 8, the actual status model creating unit 9, the boundary information selecting unit 10, and the adjacent portion comparing unit 11 will be described in a management method according to the present embodiment to be described below.

Management Method According to Second Embodiment

Figure 8:
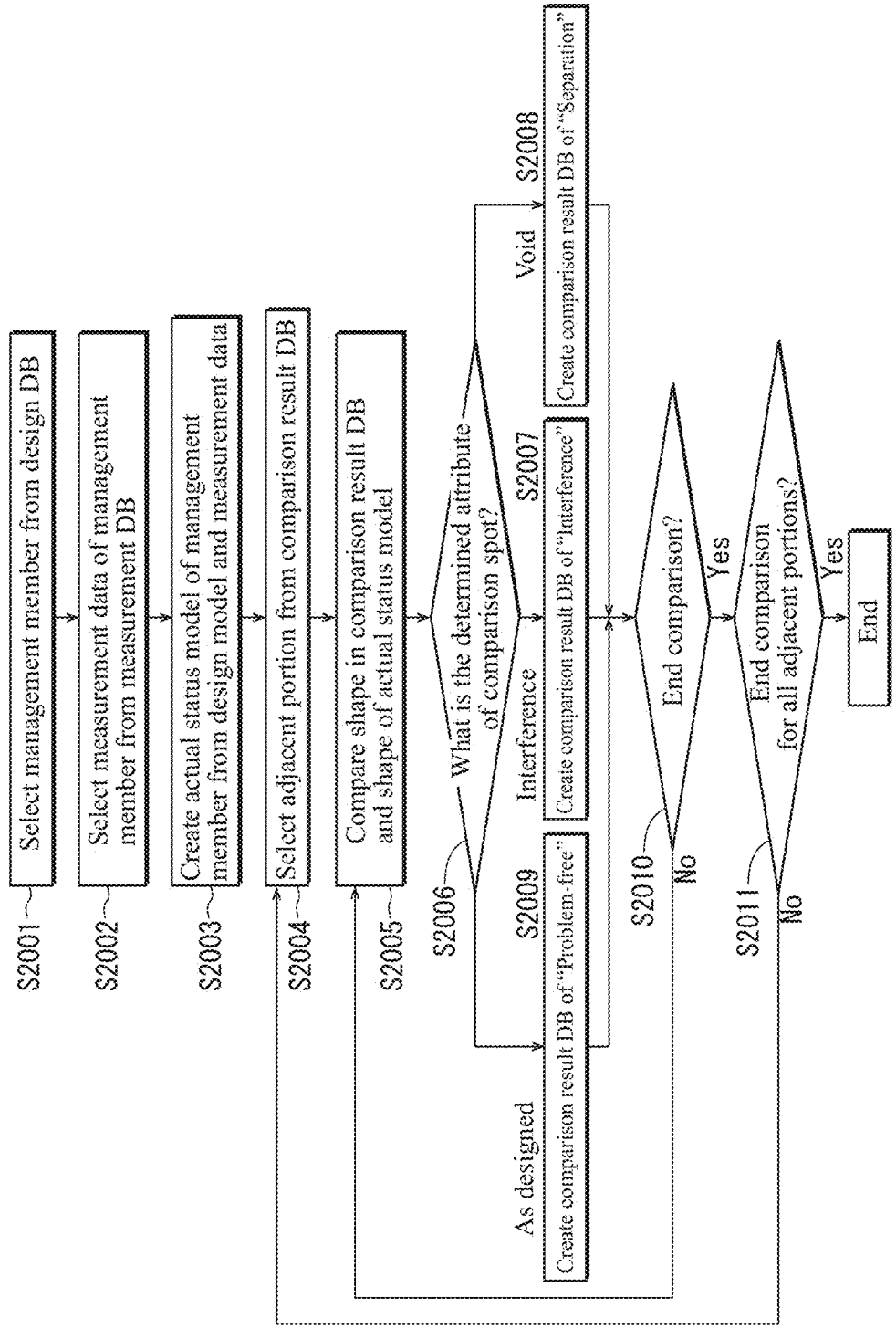
FIG. 8 is a flowchart illustrating a management method according to the second embodiment of the present invention.

FIG. 8 is a flowchart illustrating a management method according to the second embodiment of the present invention, and FIG. 9 is a work image view of the same management flow. For the same steps as in the first embodiment, the same step signs are cited and description thereof is omitted.

When a management process according to the present embodiment is started, in Step S2001, the management member selecting unit 5 causes an administrator to select a management member from the design table 31 as in Step S1001 (also refer to S2001 in FIG. 9).

Next, the processing shifts to Step S2002, and the measurement data selecting unit 8 reads point coordinates of measurement points stored in the measurement table 41, and extracts or causes the administrator to select measurement points substantially corresponding to member coordinates of the management member selected in Step S2001 through the input/output device 2. At this time, not only a measurement point whose coordinates completely match the member coordinates but also a measurement point falling within preset error values are selected.

Here, it is also preferable that, in advance, identification is made to which construction member a measurement point belongs, and a member ID corresponding to the design table 31 is provided to the measurement point in the measurement table 41. In this case, a process may be performed in which, first, in Step S2001, measurement data is selected based on the member ID of the management member, and in the next step S2002, a design model of the management member is selected.

Next, the processing shifts to Step S2003, and with respect to the management member, by using the design model and the measurement data, the actual status model creating unit 9 creates an actual status model of the management member by correcting a shape, coordinates, rotation, and inclination of the design model according to the measurement data (also refer to S2003 in FIG. 9).

Next, the processing shifts to Step S2004, and the boundary information selecting unit 10 causes the administrator to select one adjacent portion that the management member has by referring to the comparison result database 20. The administrator selects one adjacent portion based on the design model or adjacent portion IDs of the management member (also refer to S2004 in FIG. 9).

Next, the processing shifts to Step S2005, and the adjacent portion comparing unit 11 compares an adjacent portion shape read from the adjacent portion table 201 with a shape of the actual status model at adjacent portion coordinates.

Next, the processing shifts to Step S2006, and the boundary information creating unit 7 determines whether there is interference or a void between the adjacent portion shape and the shape of the actual status model, and determines the attributes of the comparison spot. As an example, in a case where, although the shape of the adjacent portion is plane, the actual status model is convex at the comparison spot (refer to S2006-1 in FIG. 9), the comparison spot is determined to be "Interference" and the processing shifts to Step S2007. On the other hand, when the actual status model is concave at the comparison spot (refer to S2006-2 in FIG. 9), the comparison spot is determined to have a "Void" and the processing shifts to Step S2008. When both of the adjacent portion shape and the actual status model at the comparison spot are plane, the comparison spot is determined to be "As designed" and the processing shifts to Step S2009. It is also preferable that, in the comparison between the adjacent portion shape and the shape of the actual status model, when the difference between these falls within a preset design error range, the comparison spot is determined to be as designed.

Figure 10:
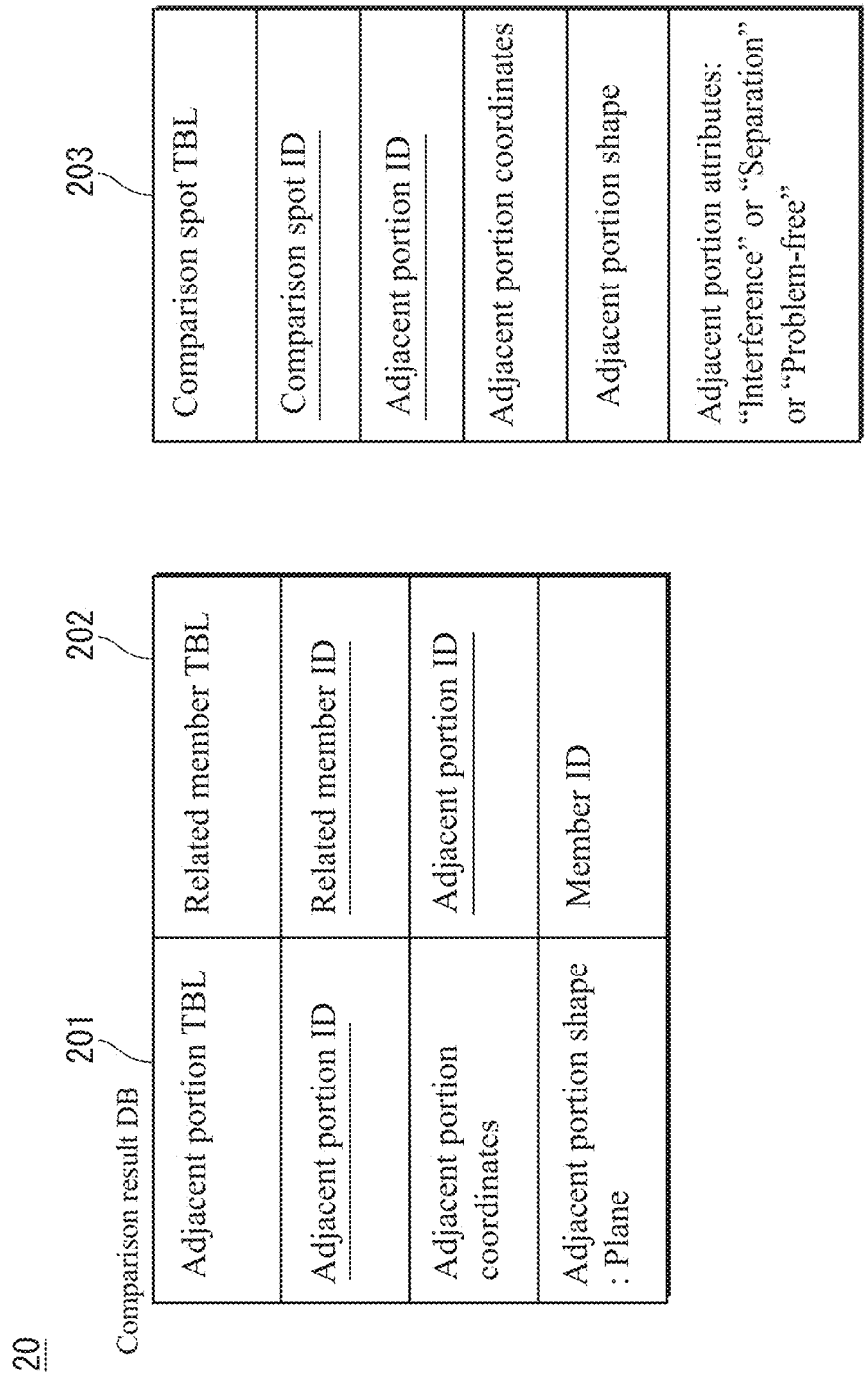
FIG. 10 is a diagram illustrating an example of a comparison result database according to the same management system.

The boundary information creating unit 7 creates a comparison spot table 203 in the comparison result database 20 as illustrated in FIG. 10. In the comparison spot table 203, preferably, identification information provided to each comparison spot (hereinafter referred to as comparison spot ID), the adjacent portion ID, comparison spot coordinates, a comparison spot shape, and as the attributes of the comparison spot, "Interference," "Separation," or "Problem-free" are stored in association with each other.

When the processing shifts to Step S2007, the boundary information creating unit 7 stores the attributes of the comparison spot as "Interference" in the comparison spot table 203 together with a comparison spot ID, the adjacent portion ID, comparison spot coordinates, and a comparison spot shape, and the processing shifts to Step S2010.

When the processing shifts to Step S2008, the boundary information creating unit 7 stores the attributes of the comparison spot as "Separation" in the comparison spot table 203 together with a comparison spot ID, the adjacent portion ID, comparison spot coordinates, and a comparison spot shape, and the processing shifts to Step S2010.

When the processing shifts to Step S2009, the boundary information creating unit 7 stores the attributes of the comparison spot as "Problem-free" in the comparison spot table 203 together with a comparison spot ID, the adjacent portion ID, comparison spot coordinates, and a comparison spot shape, and the processing shifts to Step S2010.

When the processing shifts to Step S2010, the boundary information creating unit 7 asks the administrator whether to complete the comparison work in this adjacent portion. When the administrator continues comparison at another comparison spot in this adjacent portion, the processing returns to Step S2005, and when the administrator terminates the comparison in this adjacent portion, the processing shifts to Step S2011.

When the processing shifts to Step S2011, the boundary information creating unit 7 asks the administrator whether to complete the comparison work for all adjacent portions of the management member. When the administrator continues comparison in another adjacent portion, the processing returns to Step S2004, and when the administrator terminates comparison in all adjacent portions, the flow is completed.

Figure 11:
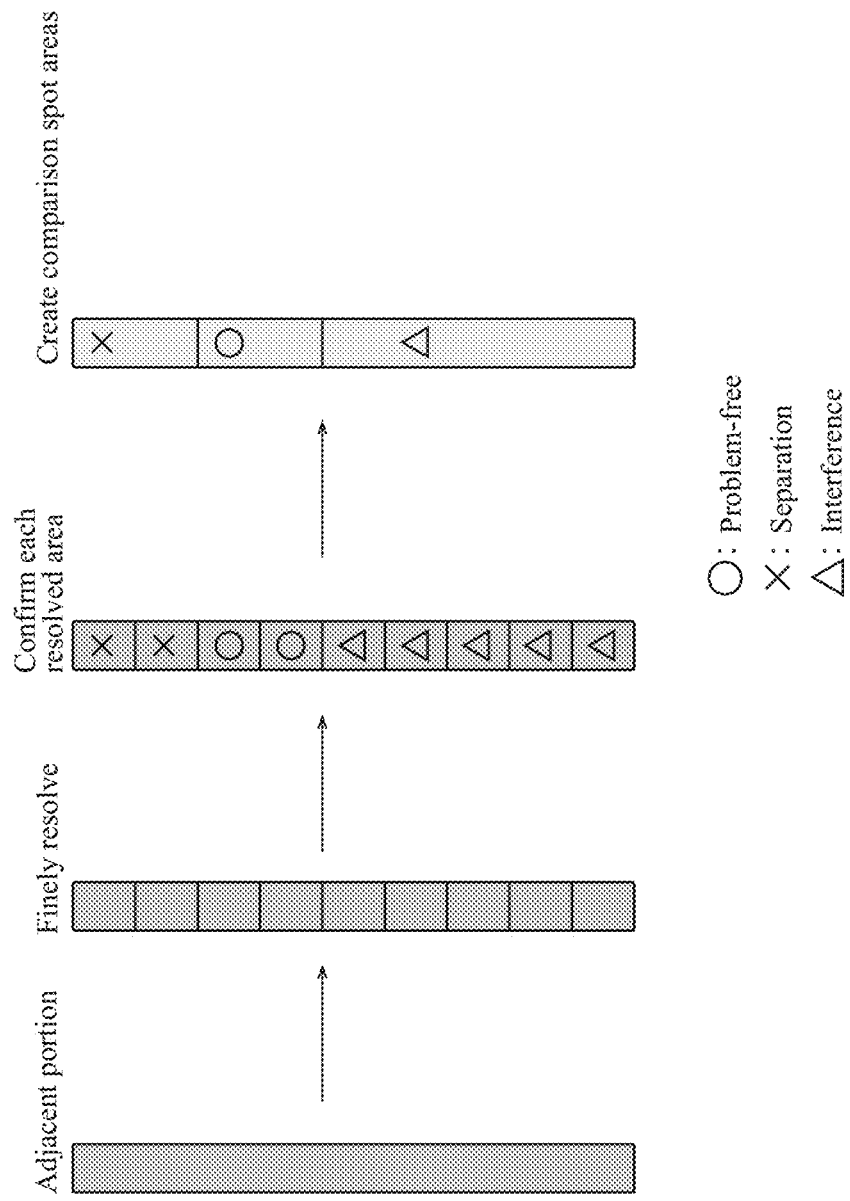
FIG. 11 is a view illustrating a work image for comparison spots in the same management method.
Figure 12:
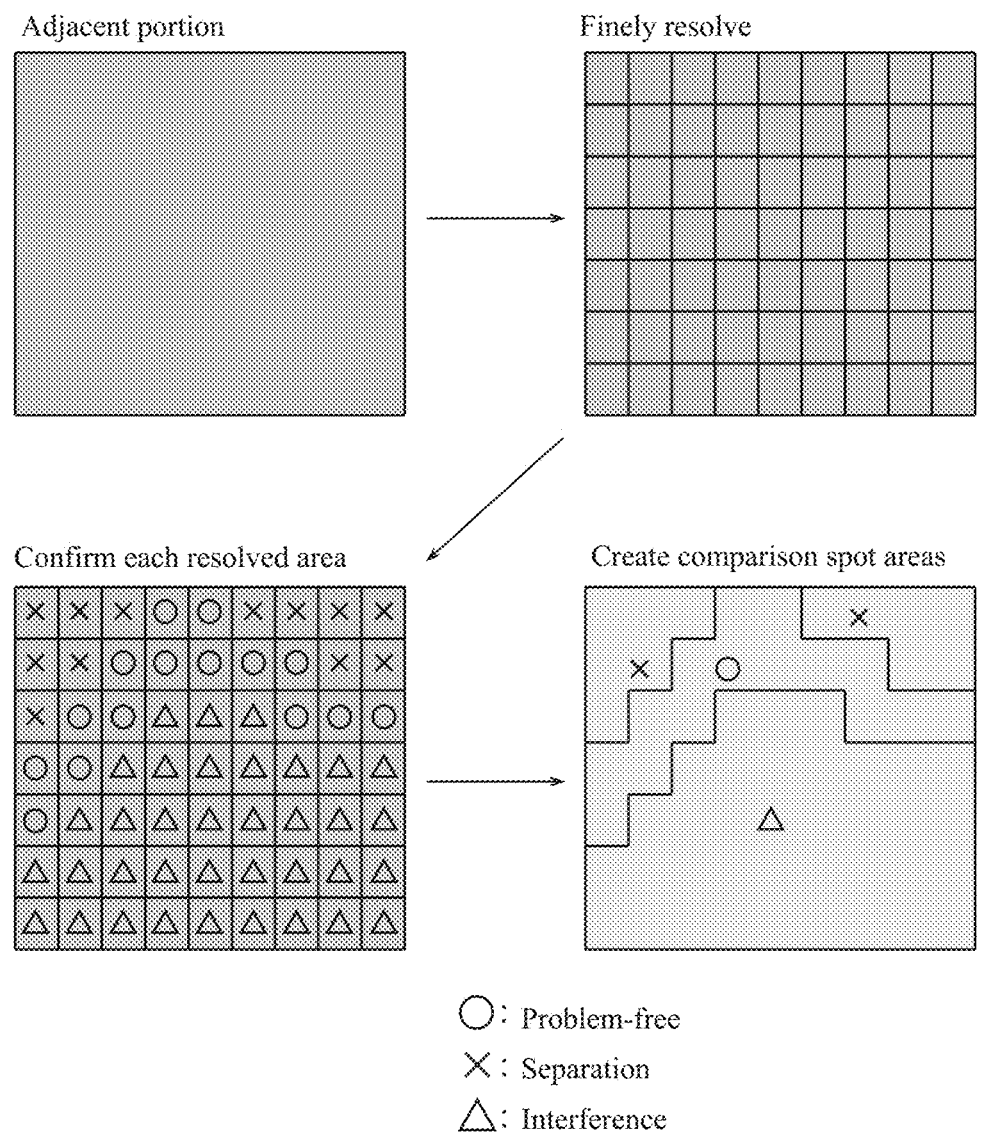
FIG. 12 is a view illustrating a work image for comparison spots in the same management method.

As a supplementary explanation, comparison spot confirming is performed in units of resolved areas obtained by finely resolving a target adjacent portion (area). Resolution may be manually set by the administrator, or may be automatically set by the adjacent portion comparing unit 11 according to 3D model drawing granularity. A work image of Steps S2005 to S2010 is illustrated in FIGS. 11 and 12. It is also preferable that, after confirming all comparison spots in the target adjacent portion, the boundary information creating unit 7 performs data management by creating comparison spot areas divided by the attributes of interference, separation, and problem-free as illustrated in FIGS. 11 and 12.

As described above, according to the management method and the management system of the present embodiment, after measurement data is reflected in a design model, based on boundary information subjected to data management in advance, whether members interfere with each other in an adjacent portion can be confirmed. Further, when members are separate from each other in the adjacent portion, the fact that there is separation in the adjacent portion can be managed as data. An interference position and a separation position can be stored in the comparison result database 20 in a manner such that their coordinates are also made clear.

Third Embodiment

A management system and a management method according to the present embodiment are for managing data including a detailed shape of a boundary portion in addition to boundary information of the second embodiment.

Configuration of Management System According to Third Embodiment

Figure 13:
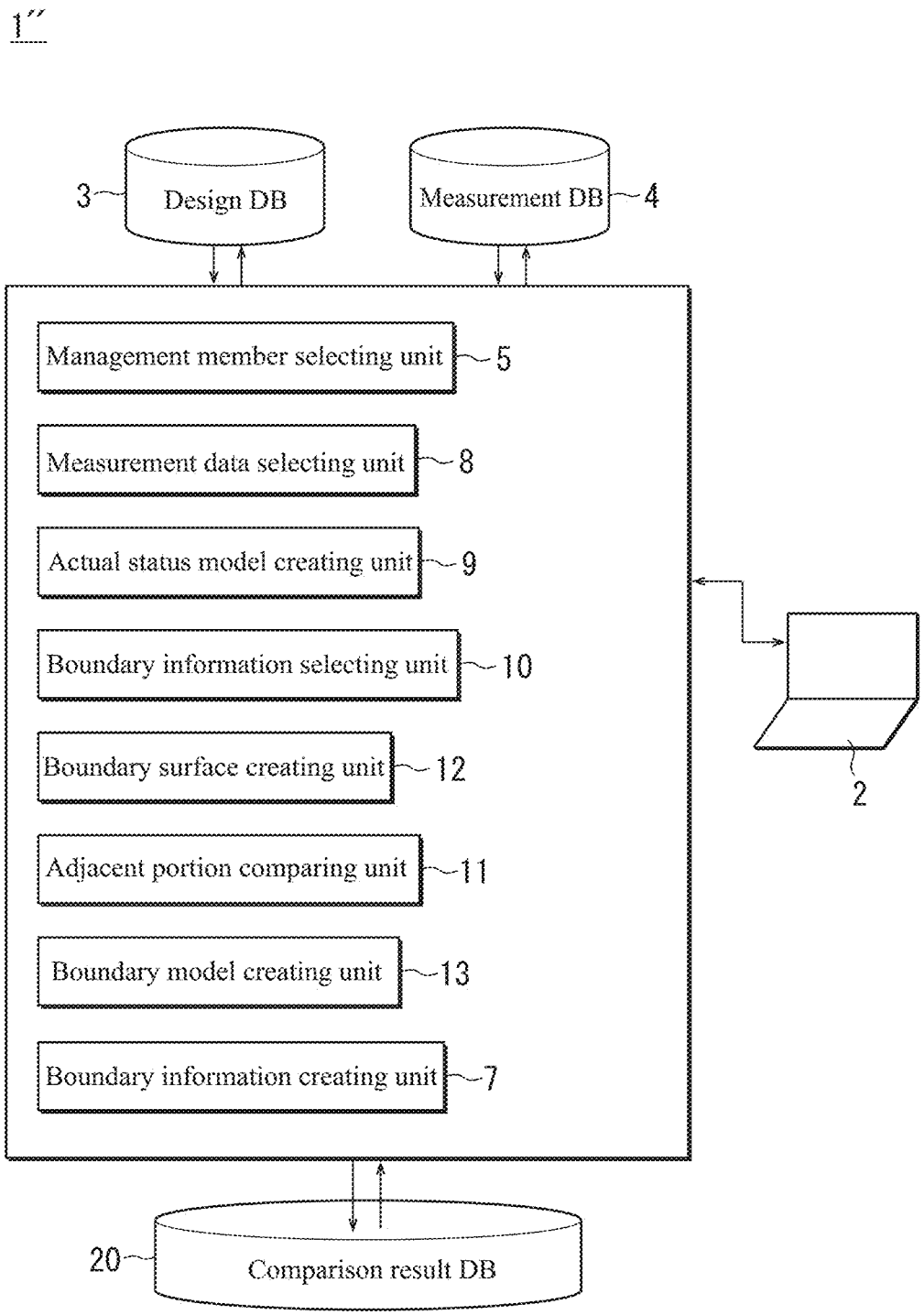
FIG. 13 is a configuration block diagram of a management system according to a third embodiment of the present invention.

FIG. 13 is a configuration block diagram of a management system 1" according to a third embodiment of the present invention. The same configuration as in the embodiments described above is provided with the same reference signs, and description thereof is omitted. The management system 1" is configured by adding a boundary surface creating unit 12 and a boundary model creating unit 13 to the configuration of the second embodiment.

The boundary surface creating unit 12 and the boundary model creating unit 13 are also configured by electronic circuits as with other functional units. The boundary surface creating unit 12 and the boundary model creating unit 13 will be described in a management method according to the present embodiment to be described below.

Management Method According to Third Embodiment

Figure 14:
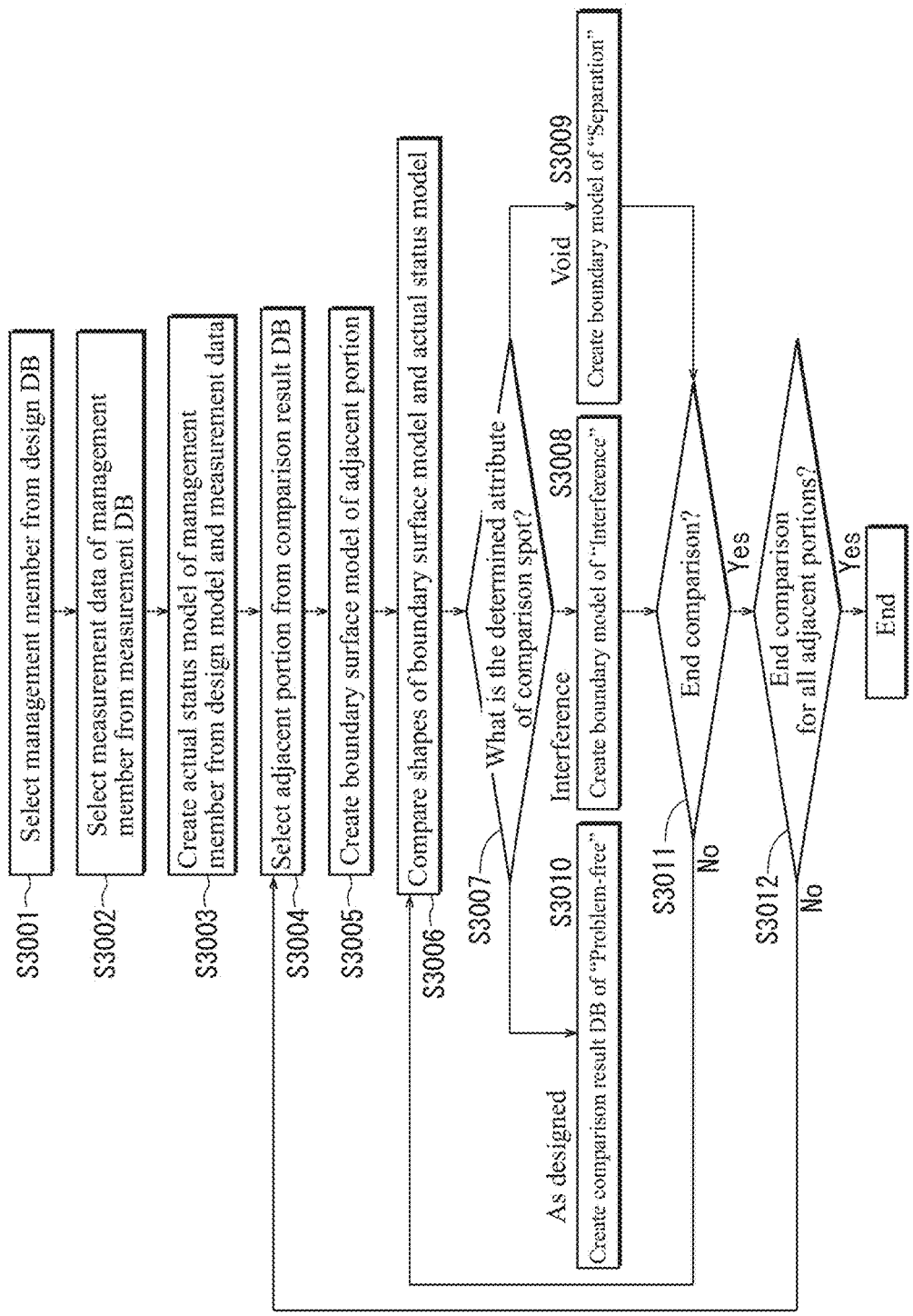
FIG. 14 is a flowchart illustrating a management method according to the third embodiment of the present invention.

FIG. 14 is a flowchart illustrating a management method according to the third embodiment of the present invention, and FIG. 15 is a work image view of the same management flow. For the same steps as in the second embodiment, the same step signs are cited and description thereof is omitted.

When a management process according to the present embodiment is started, in Step S3001, the management member selecting unit 5 causes an administrator to select a management member as in Step S2001, and in Step S3002, the measurement data selecting unit 8 selects measurement data of the management member as in Step S2002.

Next, the processing shifts to Step S3003, and as in Step S2003, the actual status model creating unit 9 creates an actual status model of the management member (also refer to S3003 in FIG. 15).

Next, the processing shifts to Step S3004, and as in Step S2004, the boundary information selecting unit 10 causes the administrator to select one adjacent portion that the management member has by referring to the comparison result database 20.

Next, the processing shifts to Step S3005, and the boundary surface creating unit 12 creates a design model of a boundary surface of this adjacent portion (hereinafter referred to as boundary surface model) from adjacent portion coordinates and an adjacent portion shape of an adjacent portion ID selected in Step S3004 (also refer to S3005 in FIG. 15) by referring to the adjacent portion table 201 (comparison result database 20).

Next, the processing shifts to Step S3006, and the adjacent portion comparing unit 11 compares a shape of the actual status model at the adjacent portion coordinates and a shape of the boundary surface model created in Step S3005.

Next, the processing shifts to Step S3007, and the boundary information creating unit 7 determines whether there is interference or a void between the boundary surface model and the actual status model, and determines the attributes of the comparison spot. As an example, in a case where although the boundary surface model is plane, the actual status model is convex at the comparison spot (coordinates) (refer to S3007-1 in FIG. 15), the comparison spot is determined to be interference and the processing shifts to Step S3008. On the other hand, when the actual status model is concave at the comparison spot (coordinates) (refer to S3007-2 in FIG. 15), the comparison spot is determined to have a void and the processing shifts to Step S3009. When both of the boundary surface model and the actual status model at the comparison spot are plane, the comparison spot is determined to be "As designed" and the processing shifts to Step S3010. In the comparison between the boundary surface model and the actual status model, it is also preferable that when a difference between these falls within a preset design error range, the comparison spot is determined to be as designed.

When the processing shifts to Step S3008, the boundary model creating unit 13 creates a boundary model of the interference portion at this comparison spot (refer to S3008 in FIG. 15). The boundary information creating unit 7 stores a comparison spot ID, an adjacent portion ID, comparison spot coordinates and a comparison spot shape based on the boundary model, and the attributes "Interference" of the comparison spot in the comparison spot table 203, and the processing shifts to Step S3011.

When the processing shifts to Step S3009, the boundary model creating unit 13 creates a model of a void portion at this comparison spot, that is, a boundary model of the separation portion (refer to S3009 in FIG. 15). The boundary information creating unit 7 stores the comparison spot ID, the adjacent portion ID, comparison spot coordinates and a comparison spot shape based on the boundary model, and the attributes "Separation" of the comparison spot in the comparison spot table 203, and the processing shifts to Step S3011.

When the processing shifts to Step S3010, the boundary model creating unit 13 creates a boundary model of this comparison spot. The boundary information creating unit 7 stores the comparison spot ID, the adjacent portion ID, comparison spot coordinates and a comparison spot shape based on the boundary model, and the attributes "Problem-free" of the comparison spot in the comparison spot table 203, and the processing shifts to Step S3011.

When the processing shifts to Step S3011, the boundary information creating unit 7 asks the administrator whether to complete the comparison work in this adjacent portion. When the administrator continues comparison at another comparison spot in this adjacent portion, the processing returns to Step S3006, and when the administrator terminates comparison in this adjacent portion, the processing shifts to Step S3012.

When the processing shifts to Step S3012, the boundary information creating unit 7 asks the administrator whether to complete the comparison work for all adjacent portions of the management member. When the administrator continues comparison in another adjacent portion, the processing returns to Step S3004, and when the administrator terminates comparison in all adjacent portions, the flow is completed.

As described above, according to the management method and the management system of the present embodiment, in addition to the second embodiment, a boundary model of an interference or separation portion is created, and data on a detailed shape of the boundary portion can be managed.

Fourth Embodiment

A management system and a management method according to the present embodiment illustrate an example of utilization of data in the comparison result database 20 (related member table 202) created in the first embodiment, and illustrate a configuration and a method for data confirmation to be enabled by managing boundary information. The same configuration as in the first embodiment is provided with the same reference signs, and description thereof is omitted.

Configuration of Management System According to Fourth Embodiment

Figure 16:
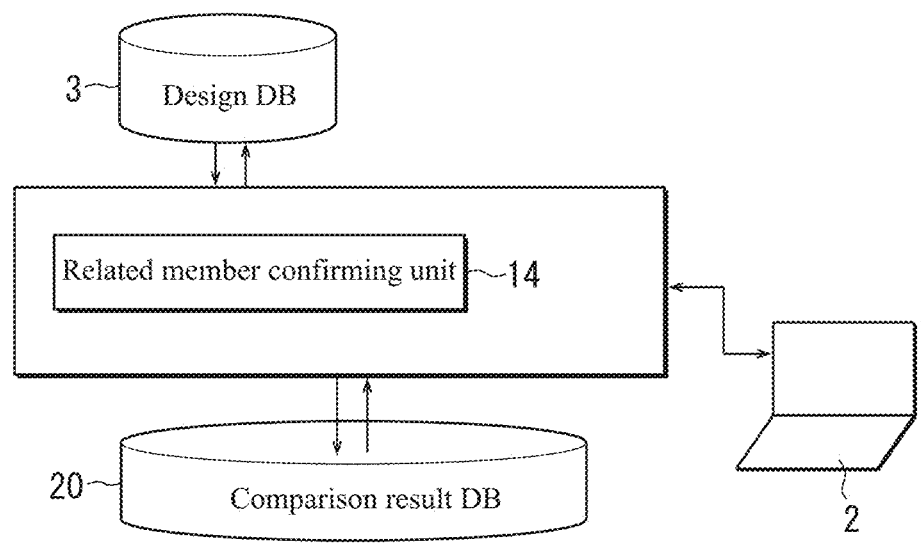
FIG. 16 is a configuration block diagram of a management system according to a fourth embodiment of the present invention.

FIG. 16 is a configuration block diagram of a management system 100 according to a fourth embodiment of the present invention. The management system 100 includes the input/output device 2, the design database 3, a related member confirming unit 14, and the comparison result database 20. The related member confirming unit 14 is also configured by electronic circuits as with other functional units. The related member confirming unit 14 will be described in a management method according to the present embodiment to be described below.

Management Method According to Fourth Embodiment

Figure 17:
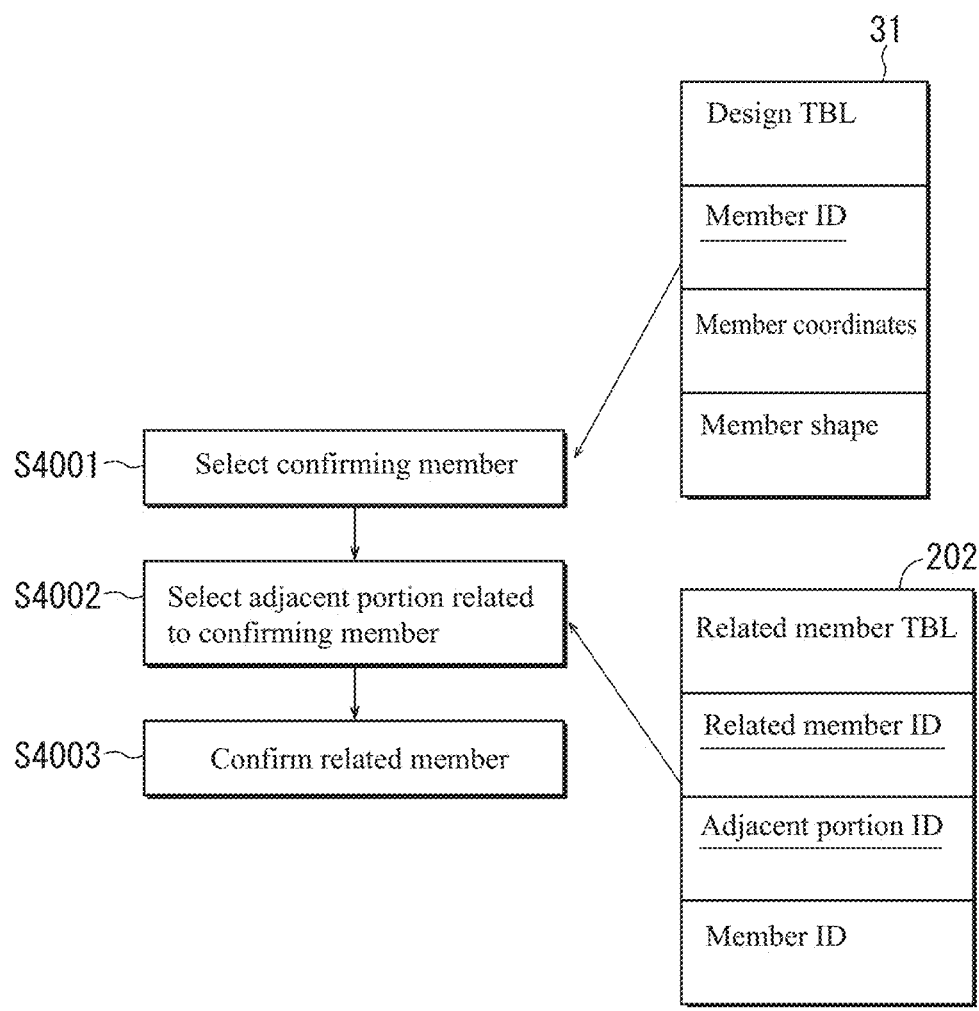
FIG. 17 is a flowchart illustrating a management method for a related member according to the fourth embodiment of the present invention.

FIG. 17 is a flowchart illustrating a management method for a related member according to the fourth embodiment of the present invention. When this confirmation flow is started, the processing shifts to Step S4001, and the related member confirming unit 14 asks for a member, and the administrator selects a "confirming member" to be confirmed from the design database 3. Next, the processing shifts to Step S4002, the related member confirming unit 14 reads the related member table 202 from the comparison result database 20 and picks up adjacent portions having a member ID of the confirming member, and causes the administrator to select an adjacent portion that the administrator wants to confirm. Next, the processing shifts to Step S4003, and the related member confirming unit 14 reads a related member linked by an adjacent portion ID from the related member table 202. Accordingly, the administrator can confirm the related member related to the confirming member.

According to the management method and the management system of the present embodiment, a related member adjacent to a member to be confirmed can be promptly identified based on boundary information between the members. In addition, the number of related members related to the confirming member can be promptly identified, so that it becomes possible to confirm and grasp the extent in which a construction deviation of the confirming member affects subsequent works.

Fifth Embodiment

A management system and a management method according to the present embodiment illustrate an example of utilization of data in the comparison result database 20 (the related member table 202 and the comparison spot table 203) created in the second or third embodiment, and illustrate a configuration and a method for data confirmation to be enabled by managing boundary information. The same configuration as in the embodiments described above is provided with the same reference signs, and description thereof is omitted. Hereinafter, the description will be given by taking the comparison spot table 203 created in the second embodiment as an example, and the same description is also given when using the comparison spot table 203 created in the third embodiment.

Configuration of Management System According to Fifth Embodiment

Figure 18:
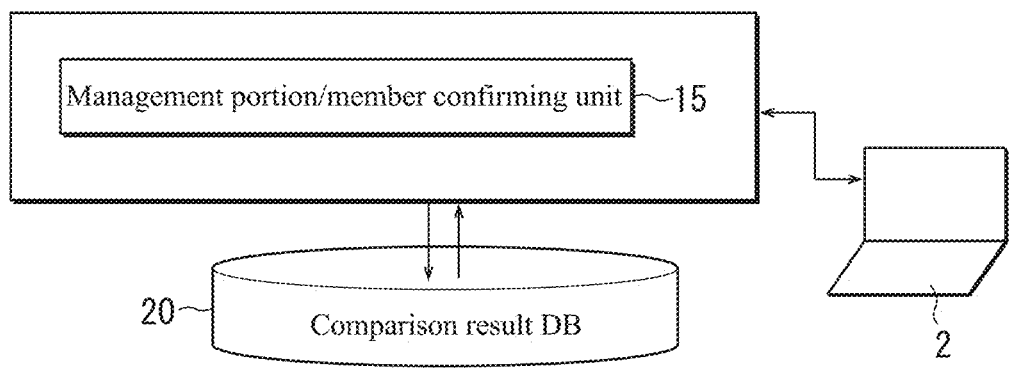
FIG. 18 is a configuration block diagram of a management system according to a fifth embodiment of the present invention.

FIG. 18 is a configuration block diagram of a management system 100' according to a fifth embodiment of the present invention. The management system 100' includes the input/output device 2, a management portion/member confirming unit 15, and the comparison result database 20. The management portion/member confirming unit 15 is also configured by electronic circuits as with other functional units. The management portion/member confirming unit 15 will be described in a management method according to the present embodiment to be described below.

(Management Method 1-1 According to Fifth Embodiment)

Figure 19:
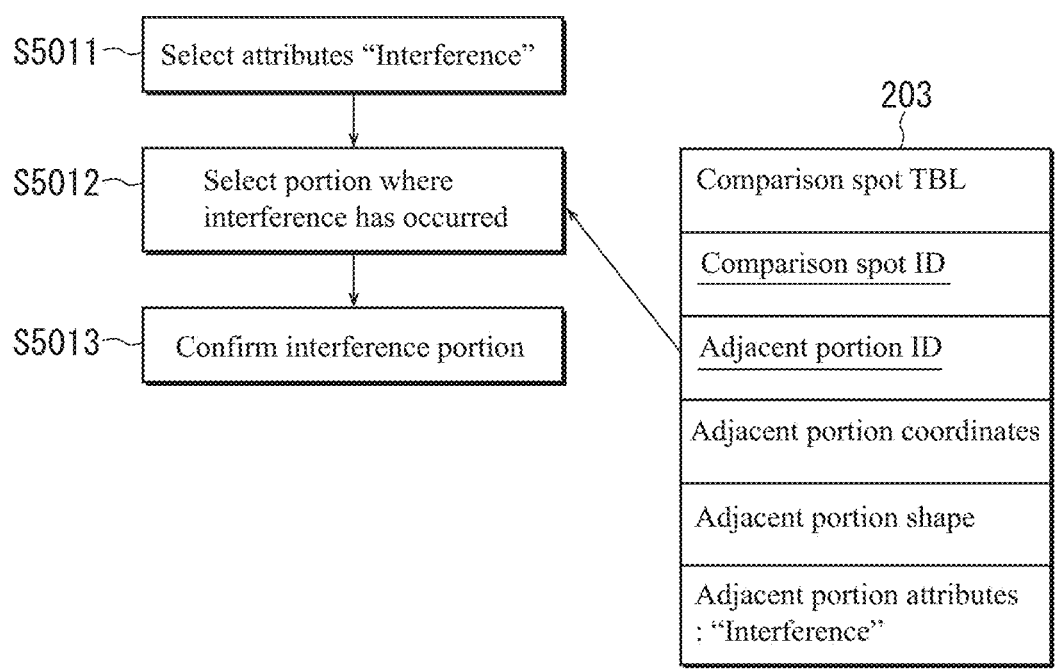
FIG. 19 is a flowchart illustrating a management method for an interference portion according to the fifth embodiment of the present invention.
Figure 20:
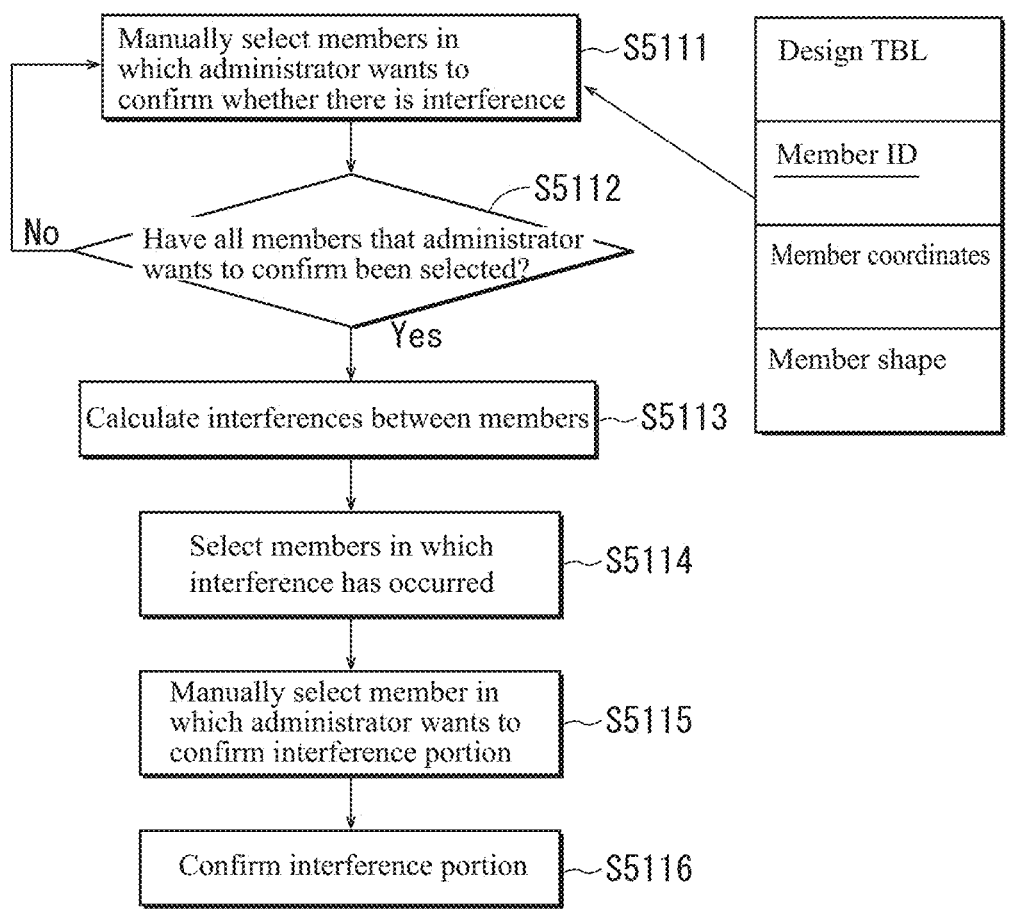
FIG. 20 is a flowchart illustrating a conventional management method for an interference portion.

FIG. 19 is a confirmation flowchart illustrating a management method for an interference portion according to the fifth embodiment of the present invention, and FIG. 20 is a confirmation flowchart illustrating a conventional management method for an interference portion for comparison.

First, a conventional confirmation flow will be described with reference to FIG. 20. When it is desired to confirm whether an "Interference portion" has occurred in data obtained by reflecting measurement data in a design model, in conventional cases, first, in Step S5111, an administrator manually selects members in which the administrator wants to confirm the presence or absence of interference from the design database. Next, the processing shifts to Step S5112, and the administrator checks whether all members desired to be confirmed have been selected. When an unselected one is found, the processing returns to Step S5111, and when all of the members are selected, the processing shifts to Step S5113. When the processing shifts to Step S5113, an arithmetic unit having a check program calculates interferences of the selected members. Next, the processing shifts to Step S5114, and the arithmetic unit selects an interference member in which interference has occurred from the result of Step S5113. Next, the processing shifts to Step S5115, and the administrator manually selects a member in which the administrator wants to confirm an interference portion from the result of Step S5114. Next, after the processing shifts to Step S5116, the administrator can confirm an interference portion of the selected member for the first time.

On the other hand, in the present embodiment, as illustrated in FIG. 19, when it is desired to confirm whether an "interference portion" has occurred in data obtained by reflecting measurement data in a design model, the management portion/member confirming unit 15 functions. When the processing shifts to Step S5011, the management portion/member confirming unit 15 asks for the attributes to be confirmed, and the administrator selects "Interference." Then, the processing shifts to Step S5012, and the management portion/member confirming unit 15 reads the comparison spot table 203 from the comparison result database 20, and picks up adjacent portions whose attributes are "Interference," and the administrator selects a portion that the administrator wants to manage. After selecting, the processing shifts to Step S5013, and the administrator can confirm an interference portion.

That is, the "interference portion" has already been managed by the comparison spot table 203, so that the administrator can promptly select and confirm the interference portion based on the attributes data of "Interference."

(Management Method 1-2 According to Fifth Embodiment)

Figure 21:
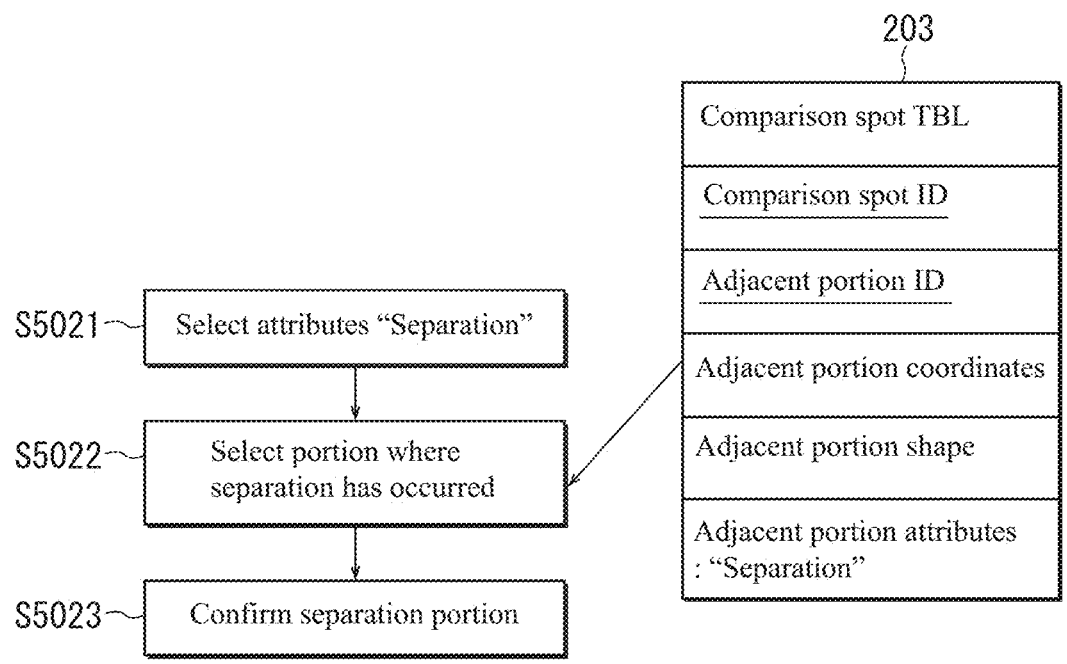
FIG. 21 is a flowchart illustrating a management method for a separation portion according to the fifth embodiment of the present invention.

FIG. 21 is a flowchart illustrating a management method for a separation portion according to the fifth embodiment of the present invention.

When it is desired to confirm whether a "separation portion" has occurred in data obtained by reflecting measurement data in a design model, in conventional cases, means to detect a void and separation between members was not established, so that it was impossible to confirm a separation portion.

On the other hand, in the present embodiment, as illustrated in FIG. 21, when it is desired to confirm whether a "separation portion" has occurred in data obtained by reflecting measurement data in a design model, the management portion/member confirming unit 15 functions. When the processing shifts to Step S5021, the management portion/member confirming unit 15 asks for the attributes to be confirmed, and the administrator selects "Separation." Next, the processing shifts to Step S5022, and since the management portion/member confirming unit 15 reads the comparison spot table 203 and picks up adjacent portions whose attributes are "Separation," the administrator selects a portion that the administrator wants to manage. After selecting, the processing shifts to Step S5023, and the administrator can confirm a separation portion.

That is, the "separation portion" has already been managed by the comparison spot table 203, so that the administrator can promptly select and confirm the separation portion based on the attributes data of "Separation."

(Management Method 1-3 According to Fifth Embodiment)

Figure 22:
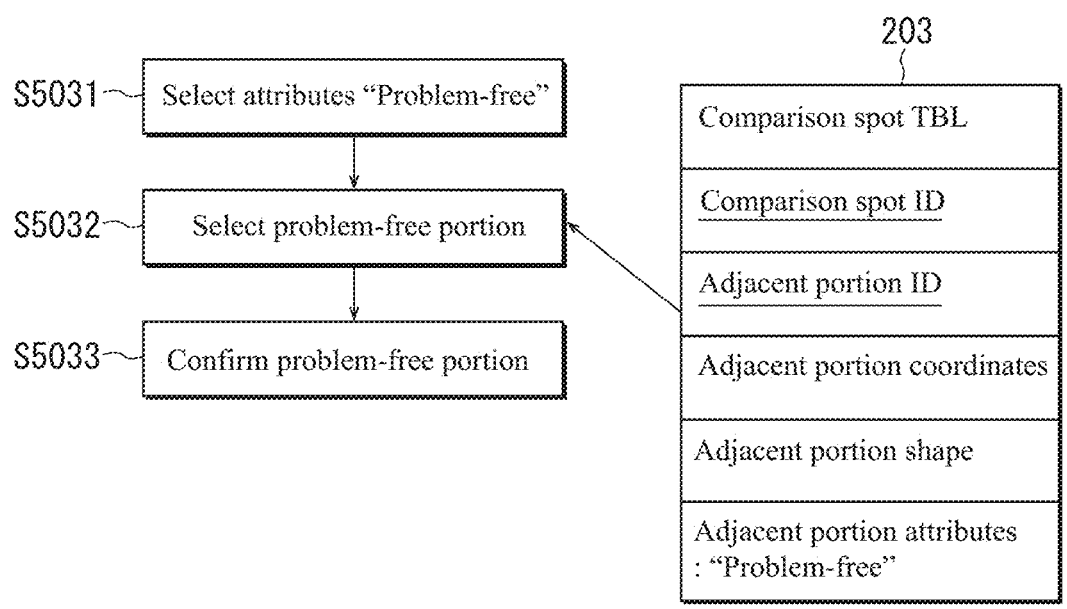
FIG. 22 is a flowchart illustrating a management method for a problem-free portion according to the fifth embodiment of the present invention.

FIG. 22 is a confirmation flowchart illustrating a management method for a problem-free portion according to the fifth embodiment of the present invention.

When it is desired to confirm, with respect to data obtained by reflecting measurement data in a design model, a portion whether it is as designed (hereinafter referred to as "problem-free portion"), as illustrated in FIG. 22, the management portion/member confirming unit 15 is caused to function, and the administrator sets the attributes of "Problem-free" in Step S5031. Next, the processing shifts to Step S5032, and since the management portion/member confirming unit 15 reads the comparison spot table 203 and picks up adjacent portions whose attributes are "Problem-free," the administrator selects a portion that the administrator wants to manage. After selecting, the processing shifts to Step S5033, and the administrator can confirm a portion that is as designed.

(Management Method 2-1 According to Fifth Embodiment)

Figure 23:
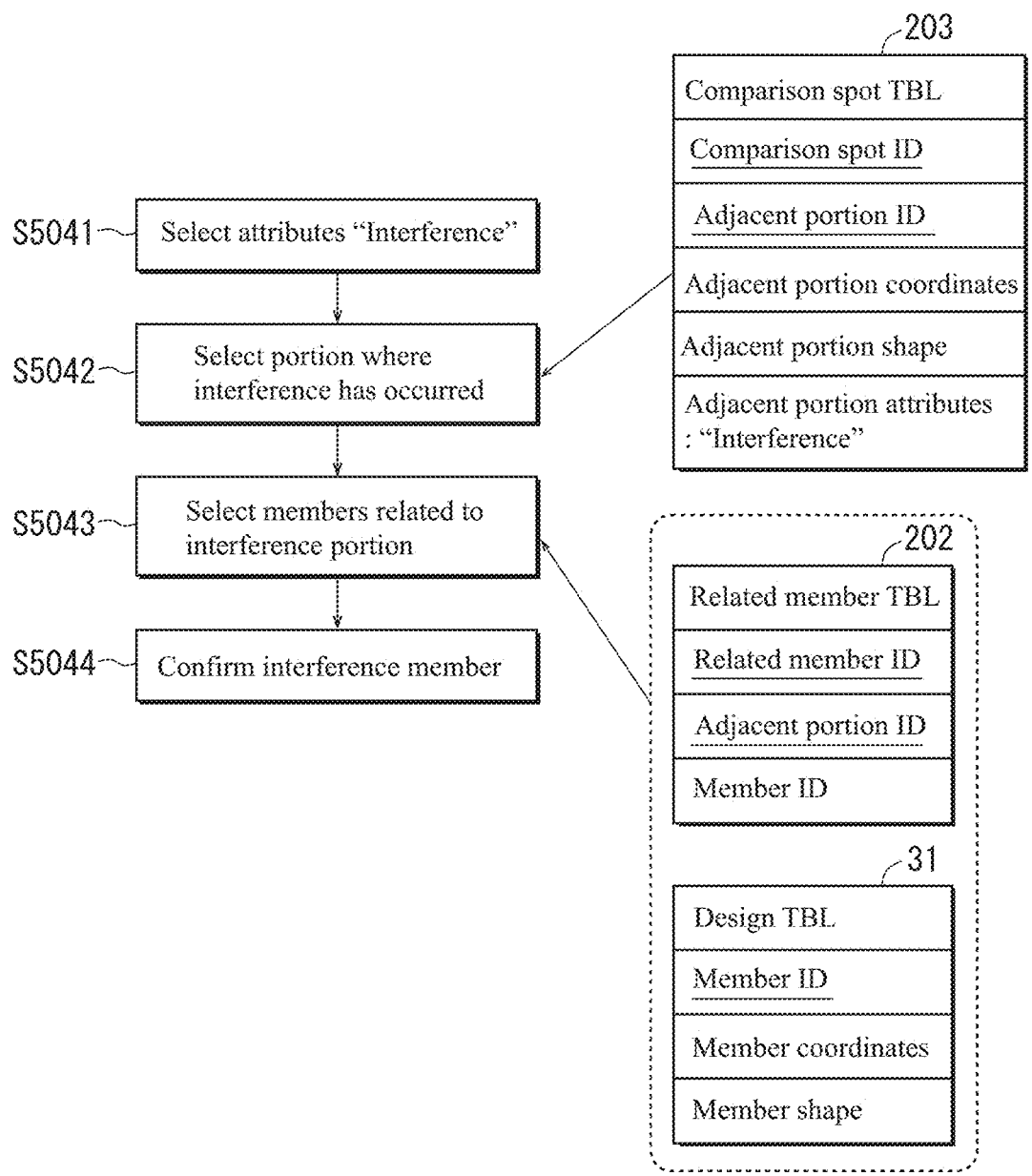
FIG. 23 is a flowchart illustrating a management method for an interference member according to the fifth embodiment of the present invention.
Figure 24:
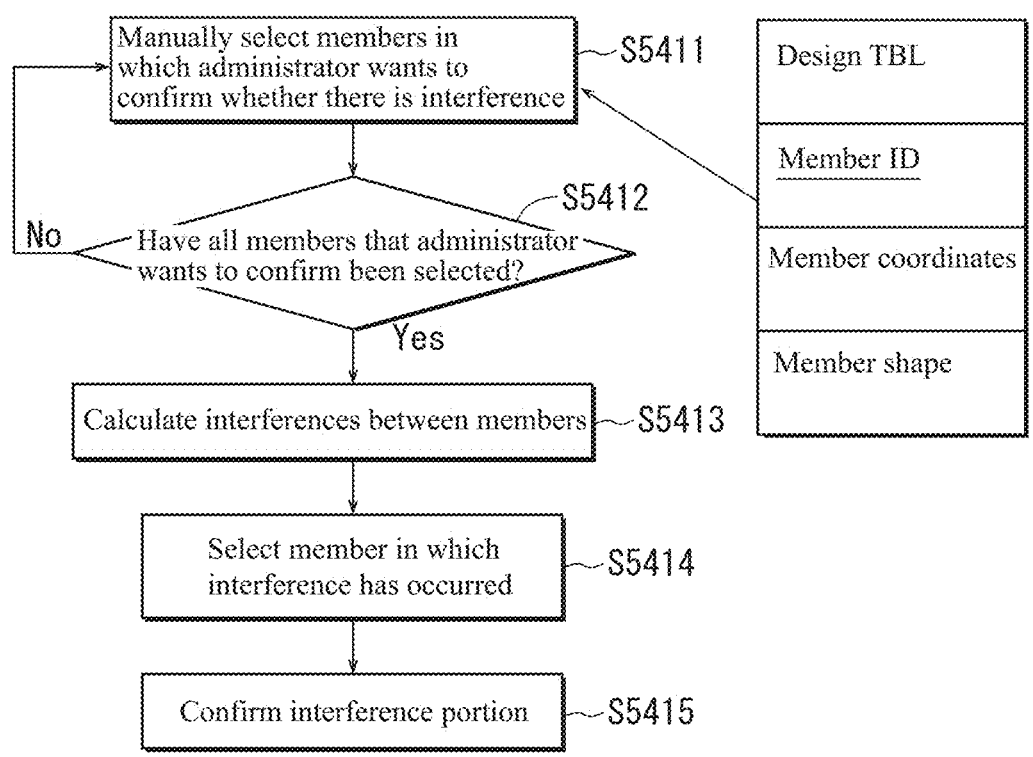
FIG. 24 is a flowchart illustrating a conventional management method for an interference member.

FIG. 23 is a confirmation flowchart illustrating a management method for an interference member according to the fifth embodiment of the present invention, and FIG. 24 is a confirmation flowchart illustrating a conventional management method for an interference member for comparison.

First, the conventional confirmation flow will be described with reference to FIG. 24. When it is desired to confirm whether data obtained by reflecting measurement data in a design model includes a "member in which interference has occurred" (hereinafter referred to as interference member), in conventional cases, first, in Step S5411, the administrator manually selects members in which the administrator wants to confirm the presence or absence of interference from the design database. Next, the processing shifts to Step S5412, and the administrator checks whether all members desired to be confirmed have been selected. When an unselected one is found, the processing returns to Step S5411, and when all of the members are selected, the processing shifts to Step S5413. When the processing shifts to Step S5413, an arithmetic unit having a check program calculates interferences of the members selected in Step S5412. Next, the processing shifts to Step S5414, and the arithmetic unit selects a member in which interference has occurred from the result of Step S5413. Next, after the processing shifts to Step S5415, the administrator can confirm an interference member for the first time.

On the other hand, in the present embodiment, as illustrated in FIG. 23, when it is desired to confirm whether data obtained by reflecting measurement data in a design model includes an "Interference member," the management portion/member confirming unit 15 functions. When the processing shifts to Step S5041, the management portion/member confirming unit 15 asks for the attributes to be confirmed, and an administrator selects "Interference." Next, the processing shifts to Step S5042, and the management portion/member confirming unit 15 reads the comparison spot table 203 and picks up adjacent portions whose attributes are "Interference," and the administrator selects an interference portion that the administrator wants to manage. Next, the processing shifts to Step S5043, and by referring to the related member table 202 based on an adjacent portion ID selected in Step S5042, the management portion/member confirming unit 15 selects members having a member ID and a related member ID stored in the corresponding adjacent portion. After selecting, the processing shifts to Step S5044, and the administrator can confirm the interference member.

That is, the "Interference member" has already been linked and managed by the comparison spot table 203 and the related member table 202, so that the administrator can promptly select and confirm the interference member based on the attributes data of "Interference."

(Management Method 2-2 According to Fifth Embodiment)

Figure 25:
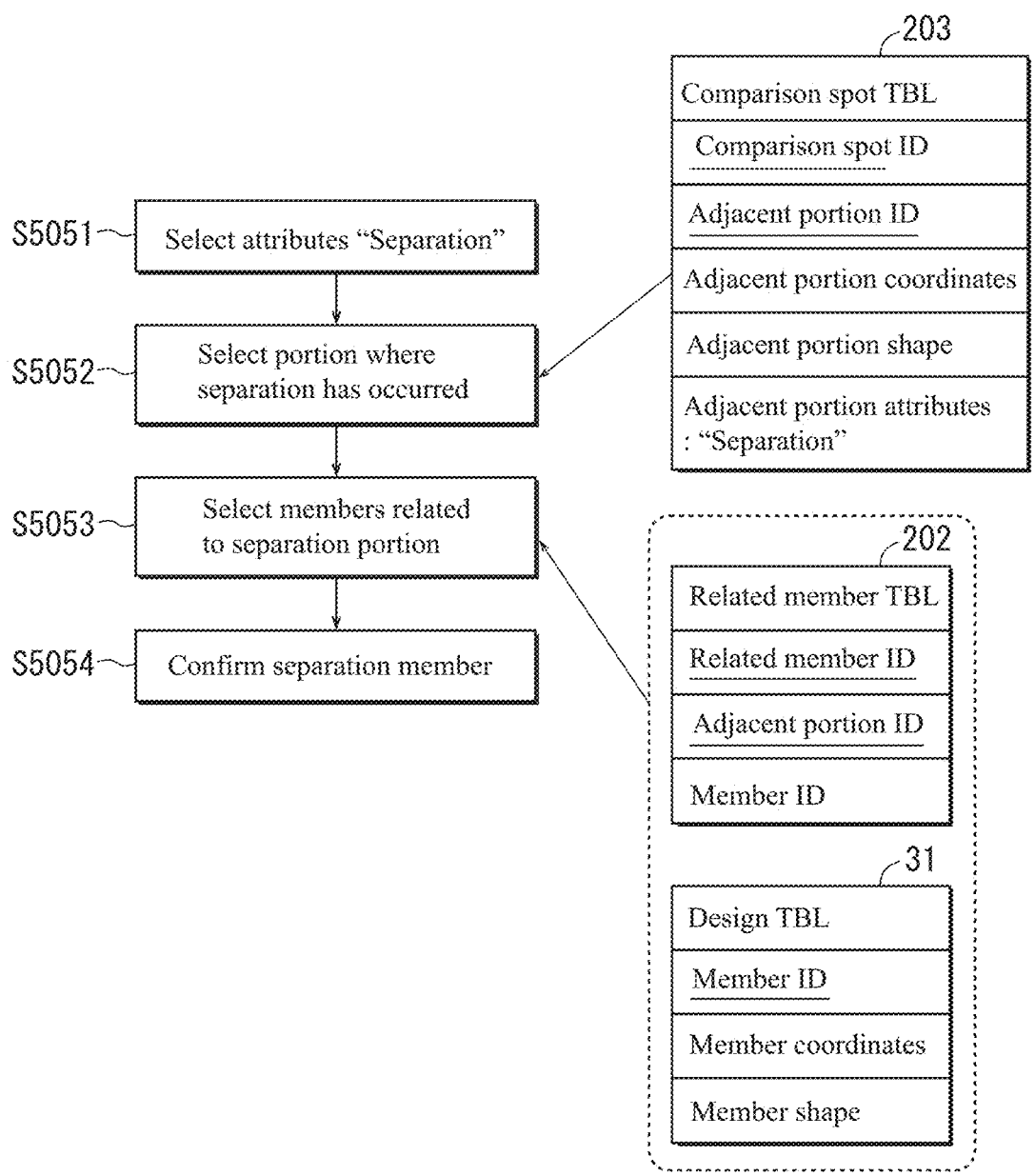
FIG. 25 is a flowchart illustrating a management method for a separation member according to the fifth embodiment of the present invention.

FIG. 25 is a confirmation flowchart illustrating a management method for a separation member according to the fifth embodiment of the present invention.

When it is desired to confirm whether a "member related to a separation portion (hereinafter referred to as separation member)" has occurred in data obtained by reflecting measurement data in a design model, in conventional cases, means to detect a void and separation between members was not established, so that it was not possible to confirm a separation member.

On the other hand, in the present embodiment, as illustrated in FIG. 25, when it is desired to confirm whether data obtained by reflecting measurement data in a design model includes a "separation member," the management portion/member confirming unit 15 functions. When the processing shifts to Step S5051, the management portion/member confirming unit 15 asks for the attributes to be confirmed, and the administrator selects "Separation." Next, the processing shifts to Step S5052, and the management portion/member confirming unit 15 reads the comparison spot table 203 and picks up adjacent portions whose attributes are "Separation," and the administrator selects a separation portion that the administrator wants to manage. Next, the processing shifts to Step S5053, and by referring to the related member table 202 based on an adjacent portion ID selected in Step S5052, the management portion/member confirming unit 15 selects members having a member ID and a related member ID stored in the corresponding adjacent portion. After selecting, the processing shifts to Step S5054, and the administrator can confirm the separation member.

That is, a "separation member" has already been linked and managed by the comparison spot table 203 and the related member table 202, so that the administrator can promptly select and confirm the separation member based on the attributes data of "Separation."

(Management Method 2-3 According to Fifth Embodiment)

Figure 26:
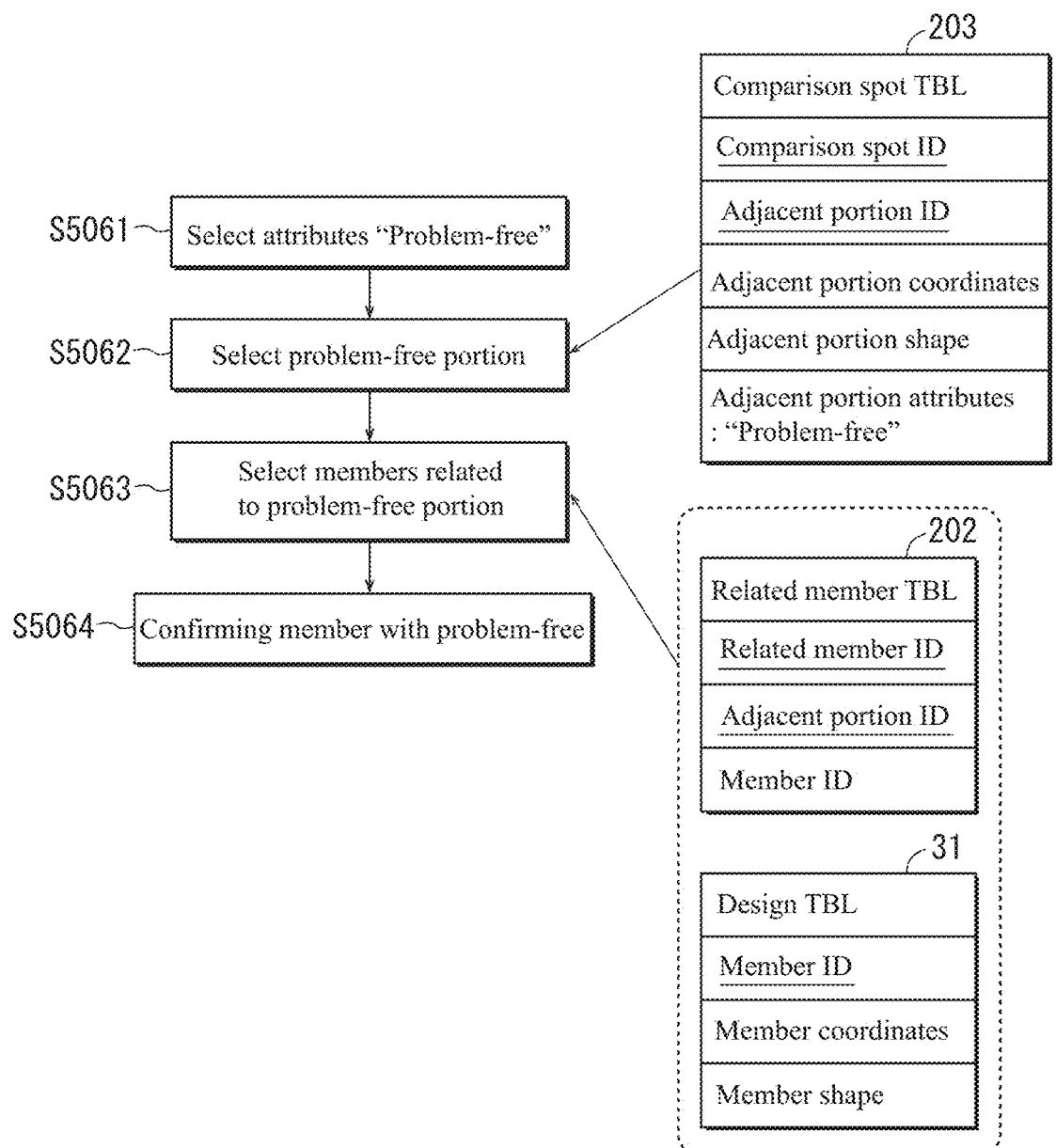
FIG. 26 is a flowchart illustrating a management method for a problem-free member according to the fifth embodiment of the present invention.

FIG. 26 is a flowchart illustrating a management method for a problem-free member according to the fifth embodiment of the present invention.

When it is desired to confirm a member that is as designed (hereinafter referred to as "problem-free member") in data obtained by reflecting measurement data in a design model, as illustrated in FIG. 26, the management portion/member confirming unit 15 is caused to function, and the administrator selects the attributes of "Problem-free" in Step S5061. When the processing shifts to Step S5062, the management portion/member confirming unit 15 reads the comparison spot table 203 and picks up adjacent portions whose attributes are "Problem-free," and the administrator selects a portion that the administrator wants to manage. Next, the processing shifts to Step S5063, and by referring to the related member table 202 based on an adjacent portion ID selected in Step S5062, the management portion/member confirming unit 15 selects members having a member ID and a related member ID stored in the corresponding adjacent portion. After selecting, the processing shifts to Step S5064, and the administrator can confirm the problem-free member.

As described above, according to the management method and the management system of the present embodiment, the efficiency of the work to confirm a state of an adjacent portion between members is significantly improved.

Sixth Embodiment

A management system and a management method according to the present embodiment illustrate another example of utilization of data in the comparison result database 20 (the related member table 202 and the comparison spot table 203) created in the second or third embodiment, and further illustrates a configuration and a method that enable data confirmation by the combined use of another classification information of members. The same configuration as in the embodiments described above is provided with the same reference signs, and description thereof is omitted. The description will be given by taking the comparison spot table 203 created in the second embodiment as an example, and the same description is also given when using the comparison spot table 203 created in the third embodiment.

Configuration of Management System According to Sixth Embodiment

Figure 27:
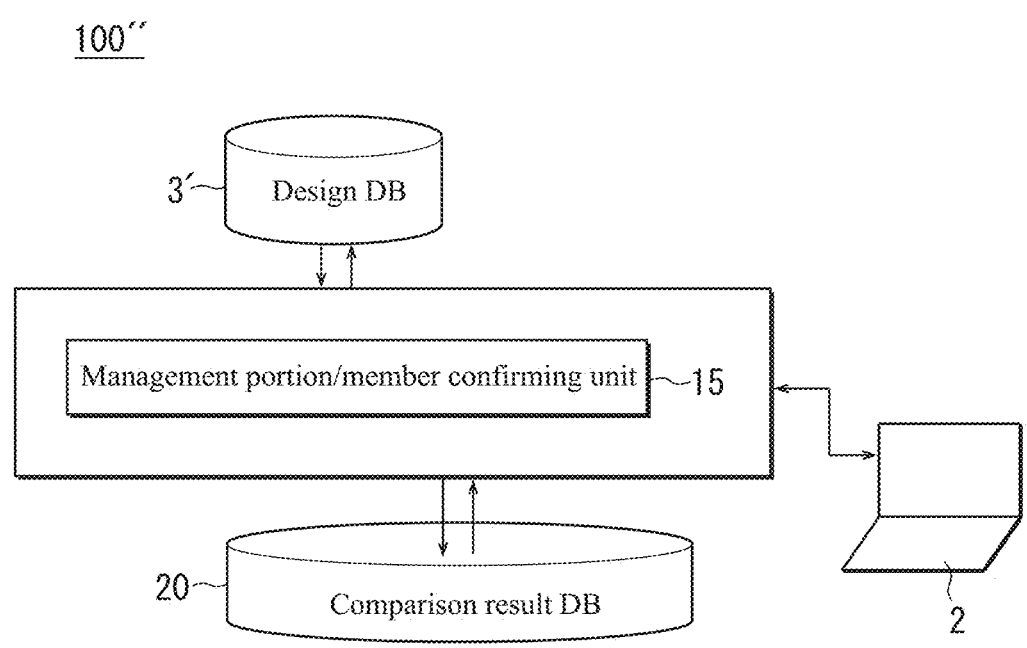
FIG. 27 is a configuration block diagram of a management system according to a sixth embodiment of the present invention.

FIG. 27 is a configuration block diagram of a management system 100" according to a sixth embodiment of the present invention. The management system 100" according to the sixth embodiment is the same as the management system according to the fifth embodiment, and further, the management system 100" transmits and receives information to and from a design database 3' including a design table 31' illustrated in FIG. 28.

Figure 28:
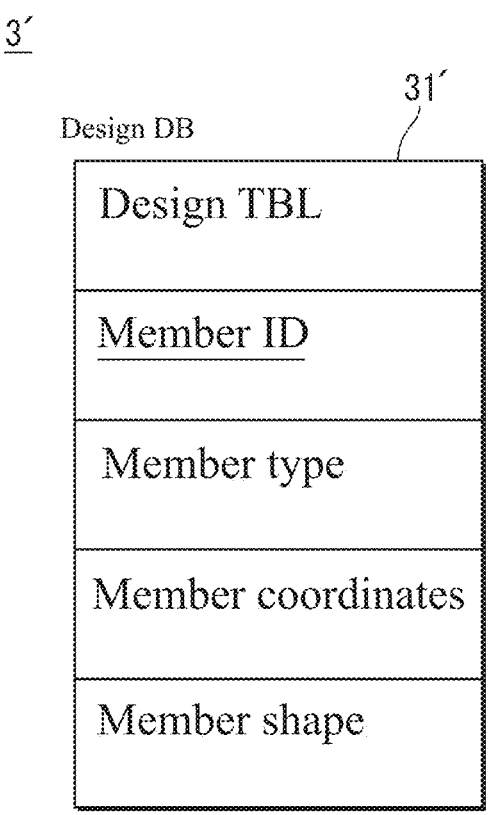
FIG. 28 is a diagram illustrating an example of a design database according to the same management system.

The design database 3' of the present embodiment includes the design table 31' in which, as illustrated in FIG. 28, with respect to each construction member, a member ID, member coordinates, a member shape, and a member type are associated with each other. Member types are types of member groups, and are "Column," "Beam," "Brace," and "Wall," etc.

Management Method According to Sixth Embodiment

Figure 29:
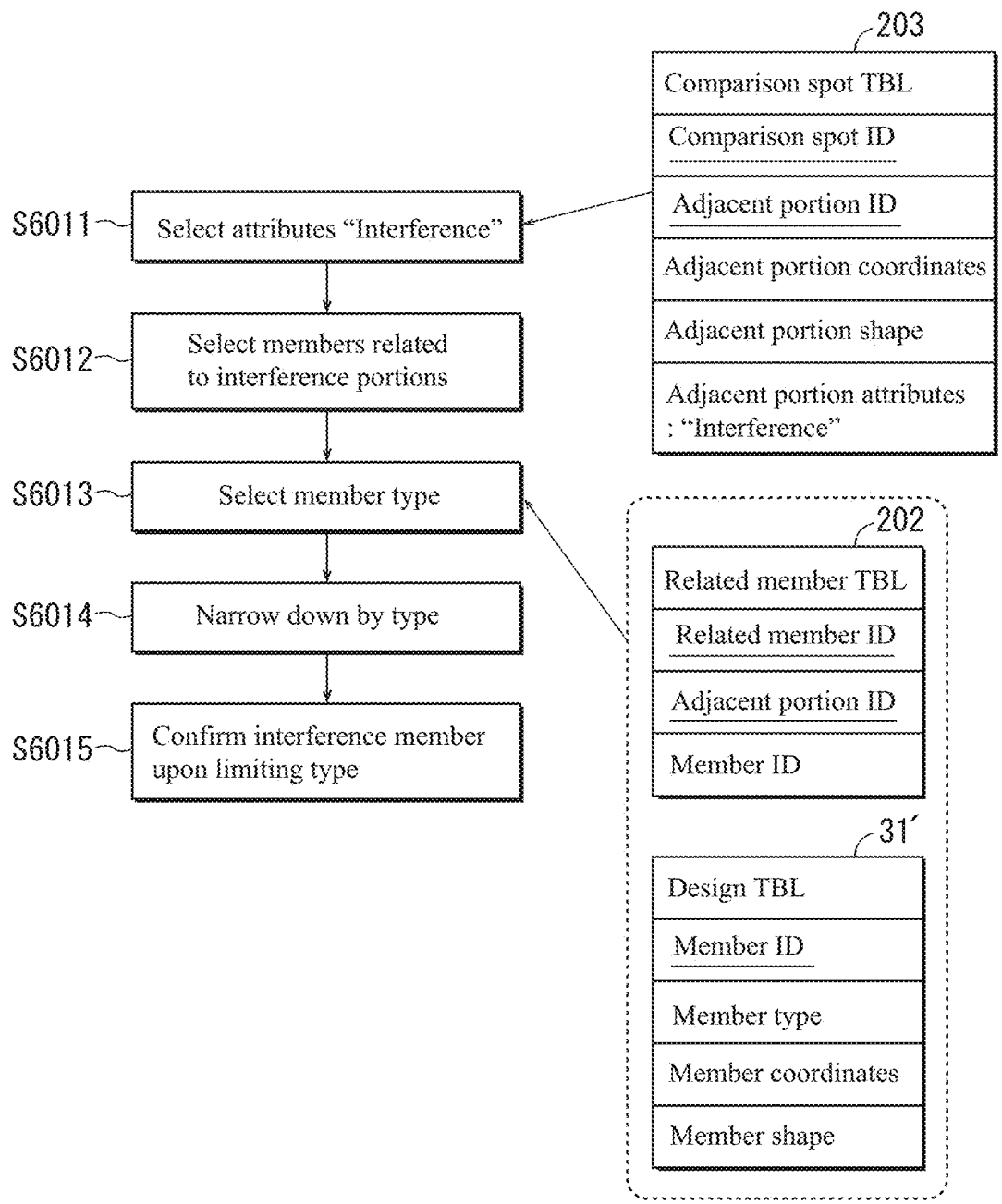
FIG. 29 is a flowchart illustrating a management method for an interference portion according to the sixth embodiment of the present invention.

FIG. 29 is a flowchart illustrating a management method for an interference member according to the sixth embodiment of the present invention. In the present embodiment, a case where "Interference" is selected from the attributes will be described by way of example, and the same description is also given when "Separation" or "Problem-free" is selected.

When this confirmation flow is started, the processing shifts to Step S6011 and the management portion/member confirming unit 15 asks for the attributes to be confirmed, and the administrator selects "Interference." Next, the processing shifts to Step S6012, and the management portion/member confirming unit 15 reads the comparison spot table 203 and picks up adjacent portions whose attributes are "Interference," and the administrator selects interference portions that the administrator wants to manage Next, the processing shifts to Step S6013, and the management portion/member confirming unit 15 asks for a member type, and the administrator selects a member type that the administrator wants to confirm. Next, the processing shifts to Step S6014, and the management portion/member confirming unit 15 refers to the design table 31' and narrows down to an adjacent portion including a member ID having the member type selected in Step S6013 among the interference portions selected in Step S6012, and for the narrowed-down adjacent portion, refers to the related member table 202 based on an adjacent portion ID, and selects members having a member ID and a related member ID stored in the corresponding adjacent portion. After selecting, the processing shifts to Step S6015, and the administrator can confirm the interference member upon limiting the member type.

As described above, according to the management method and the management system of the present embodiment, a state of an adjacent portion between members can be confirmed by the combined use of another classification information of the members such as member types. It is not intended to limit another classification information to a member type, and material information such as a fireproof material may be applied as long as the information is certain classification information related to the member.

Preferred embodiments and modifications of the present invention have been described above, and each embodiment and each modification can be combined based on the knowledge of a person skilled in the art, and such a combined embodiment is also included in the scope of the present invention.

Data stored in the comparison result database 20 in the embodiments described above can be output to an external system from the comparison result database 20, and boundary information can be used and utilized in the external system.

REFERENCE SIGNS LIST 1, 1', 1", 100, 100', 100" Management system
2 Input/output device
3, 3' Design database
4 Measurement database
5 Management member selecting unit
6 Related member selecting unit
7 Boundary information creating unit
8 Measurement data selecting unit
9 Actual status model creating unit
10 Boundary information selecting unit
11 Adjacent portion comparing unit
12 Boundary surface creating unit
13 Boundary model creating unit
14 Related member confirming unit
15 Management portion/member confirming unit
20 Comparison result database

The invention claimed is:

1. A management method comprising:
transmitting and receiving, by a device via a network, information to and from a design database storing member, including identification information, member coordinates, and member shapes of construction members constituting a construction object;
wherein displaying a design model on the device causes:
    selecting, by the device, a management member to be managed among the construction members stored in the design database;
    selecting, by the device, a related member adjacent to the management member from the design database;
    selecting, by the device, an adjacent portion between the management member and the related member adjacent;
    creating, by the device, a comparison result database based on the selecting of the related member adjacent and the selecting of the adjacent portion;
    storing, by the device, with respect to the adjacent portion, as boundary information, identification information, adjacent portion coordinates, an adjacent portion shape of the adjacent portion, member identification information of the management member, and member identification information of the related member adjacent in association with each other in the comparison result database;
selecting measurement data of the management member from a measurement database;
creating an actual status model of the management member by reflecting the measurement data in the design model of the management member;
selecting one adjacent portion of the management member by referring to the comparison result database;
comparing, with respect to the selected adjacent portion of the management member, an adjacent portion shape stored in the comparison result database with a shape of the actual status model;
determining whether there is interference or a void between the adjacent portion shape and the shape of the actual status model in the adjacent portion; and
when neither interference nor a void is found in the determining whether there is interference or a void, determining that a comparison spot being compared is designed, and storing identification information of the adjacent portion, identification information, comparison spot coordinates, and a comparison spot shape of the comparison spot in the comparison result database by setting attributes of the comparison spot as Problem-free;
in response to a result of the determination whether there is interference or a void:
    selecting, by the device, any one of interference, separation, and problem-free from the attributes;
    selecting, by the device, an adjacent portion having the attributes selected from the comparison result database; and
    confirming, by the device, the adjacent portion selected in the selecting of the adjacent portion to store a member in the selected adjacent portion having attributes.

2. The management method according to claim 1, wherein, further, whether the boundary information has been created for all related members related to the management member is confirmed, and when the boundary information is not created for all of the related members, the selections are performed for a related member for which the boundary information has not been created.

3. The management method according to claim 1, further comprising:
when interference is found in the determining whether there is interference or a void, determining that there is interference at a comparison spot being compared, and storing identification information of the adjacent portion, identification information, comparison spot coordinates, and a comparison spot shape of the comparison spot in the comparison result database by setting attributes of the comparison spot as Interference.

4. The management method according to claim 1, comprising: when a void is found in the determining whether there is interference or a void, determining that there is a void at a comparison spot being compared, and storing identification information of the adjacent portion, identification information, comparison spot coordinates, and a comparison spot shape of the comparison spot in the comparison result database by setting attributes of the comparison spot as Separation.

5. The management method according to claim 1, wherein, further, whether the comparison has been finished for all adjacent portions related to the management member is confirmed, and when the comparison is continued in another adjacent portion, the selecting one adjacent portion of the management member, the comparing, and the determining whether there is interference or a void are performed for another adjacent portion.

6. The management method according to claim 1, comprising:
transmitting and receiving information to and from a measurement database storing measurement data related to the construction object, and selecting measurement data of the management member from the measurement database;
creating an actual status model of the management member by reflecting the measurement data in a design model of the management member;
selecting one adjacent portion of the management member by referring to the comparison result database;
creating, with respect to the adjacent portion, a boundary surface model by referring to the comparison result database;
comparing, with respect to the adjacent portion, the boundary surface model and the actual status model;
determining whether there is interference or a void between the boundary surface model and the actual status model in the adjacent portion;
when interference is found in the determining of whether there is interference or a void, determining that there is interference at a comparison spot, creating a boundary model of an interference portion, and storing identification information of the adjacent portion, identification information of the comparison spot, comparison spot coordinates and a comparison spot shape based on the boundary model, and attributes Interference of the comparison spot in the comparison result database;
when a void is found in the determining whether there is interference or a void, determining that there is separation at a comparison spot, creating a boundary model of a separation portion, and storing identification information of the adjacent portion, identification information of the comparison spot, comparison spot coordinates and a comparison spot shape based on the boundary model, and attributes Separation of the comparison spot in the comparison result database; and
when neither interference nor a void is found in the determining whether there is interference or a void, determining that a comparison spot is as designed, creating a boundary model of the comparison spot, and storing identification information of the adjacent portion, identification information of the comparison spot, comparison spot coordinates and a comparison spot shape based on the boundary model, and attributes Problem-free of the comparison spot in the comparison result database.

7. The management method according to claim 1, comprising:
selecting a confirming member to be confirmed among the construction members stored in the design database;
selecting an adjacent portion having member identification information of the selected confirming member from the comparison result database; and
confirming a related member of the selected adjacent portion having member identification information from the comparison result database.

8. The management method according to claim 1, comprising:
selecting any one of interference, separation, and problem-free from the attributes;
selecting an adjacent portion having the attributes selected in the selecting any one of interference, separation, and problem-free from the comparison result database; and
confirming the selected adjacent portion having the attributes.

9. The management method according to claim 1, comprising:
selecting any one of interference, separation, and problem-free from the attributes;
selecting an adjacent portion having the attributes selected in the selecting any one of interference, separation, and problem-free from the comparison result database; and
referring to the comparison result database for the selected adjacent portion, and confirming a member stored in the adjacent portion.

10. The management method according to claim 1, wherein the design database further includes another classification information related to the construction members, and the management method comprises:
selecting any one of interference, separation, and problem-free from the attributes;
selecting adjacent portions having the attributes selected from the comparison result database;
narrowing down in the selected adjacent portions based on the other classification information by referring to the design database; and
referring to the comparison result database for the narrowed adjacent portion and confirming a member stored in the adjacent portion.

11. A non-transitory storage medium storing a computer program of the management method according to claim 1.

* * * * *